United States Patent
Sukkau

(10) Patent No.: US 8,390,290 B2
(45) Date of Patent: Mar. 5, 2013

(54) METHOD AND DEVICE FOR DETERMINING A POSITION OF A LOCAL COIL IN A MAGNETIC RESONANCE APPARATUS

(75) Inventor: Johann Sukkau, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 592 days.

(21) Appl. No.: 12/641,620

(22) Filed: Dec. 18, 2009

(65) Prior Publication Data

US 2010/0156421 A1 Jun. 24, 2010

(30) Foreign Application Priority Data

Dec. 19, 2008 (DE) .......................... 10 2008 064 105

(51) Int. Cl.
*G01V 3/00* (2006.01)

(52) U.S. Cl. ........................................ 324/318; 600/410

(58) Field of Classification Search .................. 324/318, 324/321, 322; 600/410
See application file for complete search history.

(56) References Cited

U.S. PATENT DOCUMENTS

| | | | |
|---|---|---|---|
| 5,066,915 A * | 11/1991 | Omori et al. | 324/318 |
| 5,622,170 A | 4/1997 | Schulz | |
| 6,317,619 B1 * | 11/2001 | Boernert et al. | 600/410 |
| 6,421,551 B1 * | 7/2002 | Kuth et al. | 600/410 |
| 7,180,294 B2 * | 2/2007 | Kohlmuller | 324/318 |
| 2003/0016015 A1 | 1/2003 | Eggers et al. | |
| 2006/0235291 A1 | 10/2006 | Haider et al. | |

* cited by examiner

*Primary Examiner* — Louis Arana
(74) *Attorney, Agent, or Firm* — Schiff Hardin LLP

(57) ABSTRACT

A device for determining the position of at least one local coil arranged or to be arranged on a patient bed of a magnetic resonance device has at least one optical coil marker arranged on the local coil, at least one optical sensor device to detect the coil marker, the field of view of the sensor device at least partially covering the patient bed in at least a recumbent position, and a computer that determines the coil position and/or coil orientation on the patient bed from measurement data of the sensor device. The computer can form a part of a control unit of the magnetic resonance device.

31 Claims, 18 Drawing Sheets

METHOD AND DEVICE FOR DETERMINING A POSITION OF A LOCAL COIL IN A MAGNETIC RESONANCE APPARATUS

BACKGROUND OF THE INVENTION

1. Field of the Invention

The present invention concerns a device for determining the position of at least one local coil arranged or to be arranged on a patient bed of a magnetic resonance device, and a magnetic resonance system with such a device. In addition, the invention concerns a method for position determination of at least one local coil arranged or to be arranged on a patient bed.

2. Description of the Prior Art

For various applications in the field of magnetic resonance, it is necessary to detect the position of different local coils directly arranged on a patient located on a patient bed, or directly arranged on the patient bed. Such local coils are provided in order to be able to generate exposures of higher quality of specific regions of a patient. For example, head coils, torso coils, back coils, leg coils and the like are known.

In order to be able to establish the position of these coils on the bed, it is known to produce a magnetic resonance measurement and to evaluate the acquired magnetic resonance data with regard to the coil position or orientation. However, this known procedure has disadvantages.

First, only the local coils that do not lie far from the isocenter of the magnetic resonance device are detected. The detected range is within about 25 cm around the isocenter, for instance. All local coils that lie outside of this search window are not detected or may be incorrectly detected. Magnetic resonance-specific artifacts are responsible for this, in particular the nonlinearity of the gradients outside of the field of view or disruptions by the patient himself. Even within the search window, the precision of the position detection is at best in the range of a few centimeters. Finally, the measurements are time-consuming since they require multiple seconds and scale with the number of the local coils to be detected. If it were desired to detect all local coils with this method, a patient would have to be measured from head to toe at multiple points, such that the time would extend into the range of minutes.

SUMMARY OF THE INVENTION

An object of the present invention is to provide a device with which an improved (in particular precise) detection of the coil position and/or coil orientation on the patient bed is possible.

This object is achieved according to the invention by a device for position determination of at least one local coil arranged, or to be arranged, on a patient bed of a magnetic resonance device, the device having at least one optical coil marker arranged on the local coil; at least one optical sensor device to detect the coil marker, the field of view of the sensor device at least partially (in particular completely) covering the patient bed in at least a recumbent position (in particular a completely extended position); and a computer configured to determine the coil position (in particular the coil position and coil orientation) on the patient bed from measurement data of the sensor device. The computer may form a part of a control unit of the magnetic resonance device.

According to the invention, a completely new approach to position determination of local coils on a patient bed is thus proposed that operates with the use of optical sensor devices, meaning that coil markers are used that can be detected with optical sensor devices. Within the scope of this invention, the optical range should encompass not only the wavelength range perceptible to the human eye but also the ultraviolet and near-infrared ranges. These radiation ranges have the advantage that they can be detected very well by optical sensor devices and moreover can be affected with standard optics. Three novel components are therefore significant, namely the at least one coil marker that is arranged on the local coil, the optical sensor device, and the computer that can particularly advantageously be realized as part of a control unit of the magnetic resonance device.

In comparison to the conventional method in which magnetic resonance data are measured, a number of advantages are achieved. The device is less prone to error than the conventional method since no magnetic resonance artifacts can occur. Additionally, the precision of the position determination is dependent on the resolution of the optical sensor device and can therefore be chosen to be arbitrarily high. Additionally, the evaluation time does not increase with the number of coils and in fact is extremely short, for instance in the range of one second.

If the patient bed is advantageously completely covered by the field of view of the optical sensor device, so all local coils that are located on the patient on the patient bed can be detected by the device according to the invention, not only those that lie near the isocenter, as was the case in the prior art.

The coil position or the coil orientation can then be additionally used in many ways. Non-exhaustive examples are methods in which the coil position reflects the acquisition position, and thus the knowledge of the coil position can enable an automatic positioning of the patient. Even for methods in which the coil among multiple local coils that deliver the best signal should be automatically established, the device according to the invention can be advantageously used.

For most of these methods, the coil position in the longitudinal direction of the patient bed is the relevant variable. If local coils composed of multiple similar coil elements are used in which, for example, two coil elements follow one another in the longitudinal direction of the patient bed, the coil orientation can also be relevant in order to also be able to associate the position of the individual coil elements. Therefore in an embodiment the device is fashioned to determine the coil position and possibly the coil orientation at least along the longitudinal direction of the patient bed. In every case the coil position can be determined in the relevant direction. The following description is limited to the determination of the coil position and/or coil orientation along the longitudinal direction of the patient bed, but it is emphasized that in principle the complete three-dimensional position and orientation can be determined with the device according to the invention as long as the markers the number or type of the optical sensor devices are designed for this purpose.

As mentioned, it is advantageous for the field of view of the optical sensor device to completely cover the patient bed. In the simplest case, this can be realized when the patient bed occupies a completely extended position. This position is also frequently designated as the home position. The optical sensor device then can be arranged, for example, across the extended patient bed on the cover of a magnetic resonance chamber in which the magnetic resonance device is located.

It is useful (which is why it is discussed in detail in the following) when a specific spectral range is associated with the markers, wherein the optical sensor device must then be sensitive in the selected spectral range.

Ultimately, the position of the local coil or of the multiple longitudinal section should be determined in the coordinate system of the patient bed. In principle, if measurement is made in a specific bed position, for example an extended bed position (home position), the arrangement of the optical sensor device is thus known in principle relative to the patient bed so that the position or orientation information of the local coils in the coordinate system of the patient bed can be obtained via a calibration procedure. In an advantageous embodiment of the present invention, however, the device also has at least one bed marker attached to the patient bed that can in particular be used for calibration and/or to determine the coil position and/or coil orientation. One or more such markers (which are designated as bed markers in the following) can also consequently be provided on the patient bed. Since they are firmly connected with the patient bed, they indicate a reference point in the coordinate system of the patient bed that can likewise be detected by the optical sensor device, which naturally is also fashioned to detect the bed markers.

The computer can be configured to continuously determine measurement data through the sensor device until an end criterion (in particular an insertion of the patient bed into a patient receptacle of the magnetic resonance device and/or the closing of the door of a magnetic resonance chamber in which the magnetic resonance device is located), wherein the last determined position and orientation of a local coil are stored and provided to the magnetic resonance device and/or a control unit of the magnetic resonance device. The typical workflow for positioning of one or more local coils is that initially the patient is supported on the patient bed. The necessary local coils are then fetched, connected to corresponding coil slots on the patient bed and positioned on the patient or on the patient bed, relative to the patient. Until the local coils are positioned in a fixed manner, they are consequently moved, such that only the end position (thus the last determined position and orientation of the local coil) is relevant as a coil position. In order to also be able to measure this position and orientation, according to the invention a continuous measurement is produced, with the last measured position or orientation of the local coil being tracked according to its positioning. The coil position or coil orientation is determined during this entire measurement time or in a subsequent evaluation, and the last determined value is then selected as a relevant value. For example, the insertion of the patient bed into the patient receptacle or the closing of the door of a magnetic resonance chamber can thereby serve as an end criterion. When these events occur, it is evident that the local coils cannot be moved any further. According to an embodiment of the invention, the device is fashioned to begin the continuous determination using a start criterion, in particular the plugging in of the local coil and/or the opening of the door of the magnetic resonance chamber. If a coil plug is plugged into a corresponding coil slot at the patient bed, an occurrence known as a "coil change event" is created in most magnetic resonance systems; it is thus established in the system (in particular in a control unit of the magnetic resonance device) that a local coil has just been connected. The first connection procedure of such a local coil can thus advantageously serve to start the position determination.

Naturally it is also possible to conduct a measurement procedure using the optical sensor device when initiated by a user or within a time window, although this can lead to uncertainties with regard to the actual coil positions, an possibly with regard to coil orientations.

In an embodiment of the present invention, the sensor device is a camera and the computer is fashioned for image processing of the camera images to detect the marker or markers shown in the camera images and/or images derived from these. An image-recording camera is thus used; for example, a typical CCD camera can be used. The images are then acquired in a video stream with, for example, 24 FPS, for example given a continuous determination of the coil position and/or coil orientation. The resolution of the camera should be relatively high, depending on what precision of the coil detection is required. For example, given a VGA resolution of 640×480 pixels, calculation can be made with a precision of approximately 3 mm when the objective of the camera is aligned exactly on the patient bed with a length of two meters. Substantially more precise results are possible with high-resolution cameras, for example +/−0.5 mm given a resolution of 4000×2000 pixels With the use of a camera, the marker or markers are passive, unactivated markers, in particular reflective and/or fluorescing markers. In this case, an activation of the markers themselves is thus not required since these are chosen so that they fulfill the requirements to be detected in camera images or images derived from these without special activation.

If multiple local coils are arranged on the patient bed, it is thus important for the detected markers in the camera images to be associated with the respective local coils. Therefore, the marker or markers can have a coil-specific pattern and/or a coil-specific character string. Many variants are conceivable, for example markers in the form of specific patterns (such as bar codes) or even use of serial numbers as markers, for example. In general it is advantageous for the markers to be fashioned so as to be particularly high-contrast so that they can easily be segmented by image processing methods. For example, given a measurement in the visible range, markers of the type on crash test dummies are suitable, that are used in collision experiments in the field of motor vehicles.

Alternatively, a light source can be provided to illuminate the marker or markers, in particular a UV light source or an infrared light source, in particular adjacent to the camera. If such a light source is active, the markers can either be excited first or be particularly emphasized. A particularly good contrast is achieved when the light source is arranged adjacent to the camera. The marker or markers can be retro-reflective markers, in particular markers provided with a light emission window. Retro-reflectors are widely known and are used for example in traffic to detect other traffic participants (for example pedestrians) in the dark. They reflect the majority of the light across all wavelengths, such that a correspondingly fashioned marker radiates particularly brightly upon exposure by the light source. A filter can also be provided at the marker so that, for example, only light in a specific spectral range (for example in the near-infrared range) is reflected. For example, an infrared-reflecting marker can be illuminated by an infrared light source and detected by a camera sensitive in the infrared region. In another embodiment, with a UV light source, the marker is a marker that can be excited to fluoresce by UV light. It should be noted that the marker can also be selected so that the fluorescent light lies in the visible range; a camera sensitive in the visible range can thus be used as a sensor device. The advantage of these embodiments is that the markers glow a great deal brighter and therefore are more easily detectable in the camera images within the scope of the image processing. The markers can additionally be designed so as to be inconspicuous in the visible range. The computer can be fashioned to determine the coil position and/or the coil orientation using an image processing of a difference image from one image acquired with active light source and one image acquired with the light source deactivated. This means that two images are always acquired (in particular in immediate succession), namely one with an activated light source and one with a deactivated light source. The markers now glow particularly noticeably in the one of the images while the background remains the same. By calculating the difference it is consequently possible to obtain an image in which ultimately only the markers are visible. In particular in the case of a scene illuminated with an infrared light source and detects with an infrared camera, this ideal case (that only the markers themselves are visible) is simple to achieve. In this way the image processing is extremely simplified since the segmentation can ensue in a particularly simple manner. A particularly high accuracy is thus achieved. As an alternative to taking the difference of two images, it is also conceivable (for example in the case of an excitation of markers with UV light) to produce the measurement in a darkened magnetic resonance chamber so that again ultimately only the markers are visible in the image, since only these fluoresce.

Commercially available CCD cameras are in principle also sensitive in the near-infrared range (approximately 750-1000 nm). Normally such cameras are equipped with an IR cat filter that transmits only the visible spectrum (350-750 nm) and filters out the near-infrared portion. If this IR cat filter is replaced with a near-infrared filter, the reverse effect is achieved: the visible light is suppressed and the near-infrared portion is transmitted. The camera thereby becomes a "night vision camera". This variant is extremely cost-effective. Alternatively, it is naturally also possible to use special cameras that are sensitive only in the infrared range. Cameras with a sensor made of indium-gallium-arsenide or germanium instead of silicon are examples.

An additional plug marker can be provided on the coil plug of the local coil, the coil plug being plugged into a slot of the patient bed. In present magnetic resonance systems it is typical that an internal resistance of the local coil that identifies its model is measured with the occurrence of the aforementioned "coil change event", thus with the plugging of the coil into a slot on the patient bed. For the later activation it is important to know which coil—whose coil position and possibly whose coil orientation have then been determined—is plugged into which slot, consequently how this coil can/should be activated. It is therefore reasonable—in particular in the event that coil-specific markers are used anyway—to also use an in particular coil-specific marker at the coil plug so, that the slots can be associated with the detected coils. Since the position of the slots on the patient bed is fundamentally known, a marker detected at these positions can also easily be recognized as a plug marker. Alternatively it is also possible to provide a feed line from the coil plug to the local coil, for example, so that the course of this feed line (and thus of the corresponding slot) can be established. Given the use of plug markers, the computer can be fashioned to determine at least one plug position of a local coil from the camera images and the plug position is linked with coil type information (obtained by the computer and/or a control unit of the magnetic resonance device) using the utilized slot.

In a further development of the embodiment of the invention wherein the optical sensor device is a camera), the markers are at least one diode radiating in the infrared or ultraviolet range. In this case, an active marker is used that is fed with current and/or activated. The advantage of such an embodiment is that the image processing again becomes extremely simplified since the diodes glow brightly in a specific spectral range (preferably in the infrared range) and therefore can be detected or established easily in the camera images. In order to keep the activation cost as low as possible, the diode of the coil marker is fashioned to glow continuously with the connection of the local coil to a slot of the patient bed. In such an embodiment the coil markers or the diodes can be associated with a specific local coil when a continuous position determination ensues as already described. The computer then is fashioned to associate a diode of a coil marker that is detected in the camera image with a specific local coil using the association of the point in time of the emergence of the diode light in the camera images with the point in time of the plugging of the local coil into a slot of the patient bed. As already described, the connection of the coil triggers the "coil change event", and at the same moment the diodes of the coil markers of this local coil begin to glow. If a video stream is thus acquired by the camera, and the "coil change events" are concurrently protocolled, the information of which coil markers of the coil are associated with which slot already follows by linking the points in time. If—as already described—the coil model is additionally identified (for example by a resistance measurement), this information can also likewise be associated with the coil position and/or coil orientation. The evaluation of the video signal or video stream acquired by the camera can also ensue only with the occurrence of the already discussed end criterion. The aforesaid acquired video stream is thereby divided into fragments that begin with one "coil change event" and end with another "coil change event" or the end criterion. At least one new bright point emerges in the video stream after every "coil change event", namely the image of the at least one diode. These points are tracked in the video stream until they do not move any longer, which means that the coil itself is no longer moving and thus has been positioned. The coil position can be determined from the position of this at least one bright point. If the coil orientation should also be determined, at least three diodes are required on a local coil. For example, these can be arranged on the local coil so that they lie on a straight line but exhibit different spacings from each other. The straight line is thereby in particular selected so that it runs in the longitudinal direction of the patient bed when the positioning of the local coil is finished. The orientation in the longitudinal direction of the patient thus can also be determined.

If such diodes are used, the image processing can be even further simplified when the computer is fashioned to binarize the camera images (i.e., convert them to binary images) using a threshold such that only the diode light remains visible in the camera images. A threshold method is thus implemented for every camera image, which method associates the value 1 with the diodes glowing particularly brightly in the selected spectral range (as already mentioned, preferably in the near-infrared range), for example, and associates the value 0 with all other points. An image is then created that shows the position of diodes as points.

If infrared diodes (thus in the infrared range) are used, the already discussed cameras can be used, in particular a commercially available CCD camera with a near-infrared filter.

It is again emphasized that, given the use of such diodes, coil-specific coil markers are no longer necessary since an unambiguous association is already enabled without any problems via the "coil change event" and the corresponding point in time of the emergence of the coil marker.

In general, given use of a camera the problem also exists that patients have different thicknesses, and therefore even given the assumption of an average height of patients, projection errors can occur given local coils placed on the patients, and have projection errors can lead to an incorrect determination of the position. According to the invention, therefore, more than one camera is provided and the computer is fashioned to determine the coil position by triangulation of the data of multiple cameras. Such projection errors can be eliminated in this way.

In a embodiment of the device according to the invention, the sensor device is a PSD device that is sensitive in the infrared range and the markers are at least one infrared diode that can be activated to operate. The abbreviation PSD stands for "position-sensitive device". A PSD sensor is a flat semiconductor in which the internal resistance changes depending on the position of a light point so that measurement currents tapped on both sides likewise vary. The position of the focal point of the light can be calculated from the ratio of the two currents (what is known as the lateral photoeffect). Such PSD devices have a number of advantages, in particular in comparison to a camera. First, PSD sensors are very fast; for example, they can be operated with a frequency of 10 kHz (in comparison to a camera, which acquires for example 20-30 images per second). Additionally, PSD sensors measure in analog and are thus very precise. Additionally, the data density is relatively low and the evaluation of the sensors turns out to be very simple. Finally, PSD sensors are very advantageous in terms of procurement.

Essentially, two embodiments are conceivable since there are two different embodiments of PSD sensors. The PSD device can be a PSD sensor with optics upstream thereof, the optics expanding the field of view of the PSD sensor to the entire area of the patient bed. In this case a standardized PSD sensor is used in which the corresponding currents are tapped at two sides of a contiguous semiconductor surface. Such PSD sensors are also called one-dimensional PSD sensors and measure the focal paint position of the incident light.

In a preferred alternative, the PSD device has a PSD sensor fashioned for angle measurement. In such PSD sensors fashioned for angle measurement (also called combined PSD sensors), one-dimensional PSD sensors are combined on two sides of a divider element. Given use of such a PSD sensor fashioned for angle measurement, it is not the position of the incident light on the PSD sensor that is obtained but rather the angle directly, such that an upstream optic is no longer required and the calculation processes are also simplified.

However, PSD sensors can only process a single point of light; this means that only a single infrared diode may ever be active. Therefore the infrared diodes can also be individually activated in this invention embodiment. In order to now know what is specifically determined for a position, it is required that the infrared diodes be placed in relation to corresponding markers, in particular the coil markers. The computer and/or the control unit of the magnetic resonance device is fashioned to activate the diodes of the coil marker via control connections of the slots of the patient bed. In such an embodiment, control lines for the diodes of the coil markers (or in the event that it is provided, also the diodes of the bed markers) are thus specifically fed with current, in particular in fixed, predetermined cycle. These control lines can moreover also be "shared" lines (as will be explained further in the following) with which otherwise different components of the coil would be activated. The local coil must then only be modified insofar as that the additional infrared diode is mounted. Given this activation it is important that synchronicity exists. The computer and/or the control unit can therefore be fashioned for successive, synchronous activation of a respective diode of a bed marker or of a control connection and the PSD device to acquire sensor data. This means that, when an infrared diode is made to glow, measurement data are always also acquired that are associated with this infrared diode.

In this embodiment, a diode also does not need to be present for every control signal. If the patient bed has ten slots, for example, two control connections are associated with each of these slots (even if the coil orientation should be determined) and if the patient bed additionally has two bed markers each with a diode, 22 successive activation signals are thus consequently sent that can illuminate a diode (if it is connected). Consequently, if no signal is detected with the PSD device, this merely means that no local coil is presently connected at the corresponding slot, for example.

As noted above, the data volume and the data evaluation given PSD sensors is a great deal less than with other types of sensors. Therefore, in an embodiment with PSD sensors it is generally preferable to use a microcontroller for evaluation that respectively determines positions associated with a diode and, for example, relays them to the control unit of the magnetic resonance device. In the present case of the successive, synchronous activation, the computer has a microcontroller to determine position information associated with individual diodes or control connections and provided with a time stamp. This information can naturally also be expanded with additional information. As noted above, by measurement of a specific resistance it can be established which model of a local coil is presently connected to a slot of the patient bed. The computer (in particular the microcontroller) is configured to associate a coil type with position information using slot-specific coil type information obtained by the computer and/or a control unit of the magnetic resonance device.

Overall, the device can be used to implement a method in which a continuous measurement is initially begun in the described manner—for example the opening of a door of a magnetic resonance chamber and/or a "coil change event"—due to a start criterion, until an end criterion—the closing of the door of the magnetic resonance chamber and/or the insertion of the patient bed into the receptacle of the magnetic resonance device—is ended. During this time, all infrared diodes of the coil marker and/or of the bed marker are continuously triggered in sequence (thus are fed with current) and the emitted light is detected by the PSD device. In order to obtain an optimally good signal/noise ratio, this measurement occurs multiple times per second. The measurement by the PSD device and the triggering of the infrared diodes ensue synchronously. During the measurement, a continuous data stream is thus created with the following content: time stamp, number of the infrared diode (or alternatively a triplet of slot number, control connection number and coil identification information), and position information, or alternatively (if it should be evaluated later) the sensor data. The content may also include the table position, when this position is variable. As already described, this data stream is then finally evaluated to the extent that the last position is initially determined for every infrared diode, from which the coil position and/or the coil orientation can then be determined since the diode is associated with a control connection (thus a slot) and the slot is in turn associated with a local coil. In this case, it is naturally sufficient to use two infrared diodes per local coil/slot to determine the coil orientation in the longitudinal direction of the patient bed, since it is known which of the two infrared diodes is associated with received position information.

Control lines of the local coil that are not required outside of the acquisition operation can be used to activate the diodes. An example of such control lines are PIN diode control lines. The PIN diodes typically serve to disconnect the local coil in the event that a current flow through this should be avoided during the magnetic resonance measurement. The PIN diode thus functions as a switch. While the patient bed is extended and the local coil are positioned, these control lines are in principle unnecessary. Therefore, according to the invention they can be used to feed the infrared diodes with current. The illumination of the infrared diodes does not disrupt the subsequent magnetic resonance measurement; the activation and deactivation of the local coil does not otherwise disrupt the position detection. The changes to the coils would thus be minimal, and in particular additional control connections to the slots would also not be required.

As mentioned, two independently controllable infrared diodes can generally be provided for every local coil when the coil orientation should be determined in one direction (in particular the longitudinal direction of the patient bed).

Even with the use of PSD devices, the problem of projection error occurs when local coils of different heights or thicknesses are placed on patients. Therefore, more than one PSD device can be provided and the computer can be configured to determine the coil position by triangulation of the data of multiple PSD devices. Additional coordinates of the local coil can also be determined given the use of multiple PSD devices, for example the coil position in the transversal direction (perpendicular to the longitudinal direction of the patient bed) given the use of two PSD devices, or all spatial coordinates of the infrared diode (and thus of the local coil) given the use of three PSD devices.

In general, the use of markers that do not emit in the visible range—thus the use of infrared or UV markers—has the advantage that the markers do not negatively affect the optical appearance of the coils (or of the bed/coil plugs).

In addition to the device, the present invention also concerns a magnetic resonance system with such a device. For example, the magnetic resonance system can have a magnetic resonance data acquisition unit (scanner) having a chamber in which the magnetic resonance device is arranged. The sensor device to detect the coil markers (the field of view of which sensor device completely covers the patient bed located in the home position) can then be mounted on the cover of the magnetic resonance chamber. All statements above with regard to the device for position determination are applicable to the magnetic resonance system.

The present invention also concerns a method for position determination of at least one local coil arranged or to be arranged on a patient bed of a magnetic resonance device, wherein sensor data of at least one coil marker arranged on the local coil are acquired by means of at least one optical sensor and the coil position and/or coil orientation is/are determined from the sensor data.

All preceding designs and embodiments are applicable to this method according to the invention.

DESCRIPTION OF THE PREFERRED EMBODIMENTS

Figure 1:
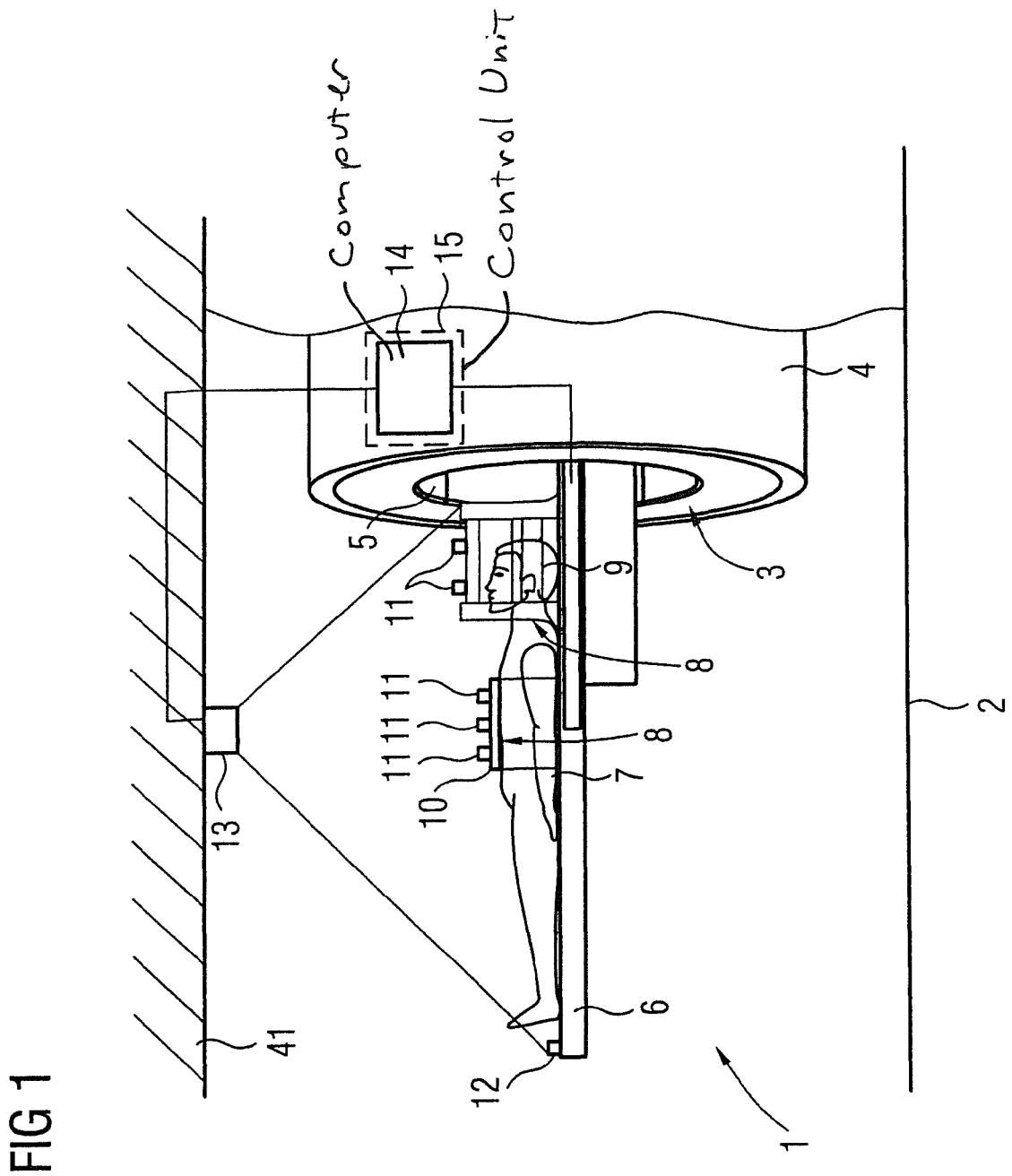
FIG. 1 provides a general representation of the basic components of the present invention.

FIG. 1 shows the basic components of a magnetic resonance system 1 according to the invention with a device according to the invention for the position determination of at least one local coil. The magnetic resonance system 1 has a magnetic resonance data acquisition system 3 arranged in a magnetic resonance chamber 2, of which the basic field magnet 4 and the patient bed 6 that can be driven into a receptacle 6 are shown in detail. At the patient bed 6, local coils 8 can be arranged on a patient 7 laying there, wherein a head coil 9 and a coil 10 to be arranged on the abdomen of the patient 7 are presently shown as examples.

As noted, the magnetic resonance system 1 has a device according to the invention that serves to determine the position of the local coils 8. This position determination device includes coil markers 11 and bed markers 12 that are arranged on the local coils 8 and the patient bed 6, respectively. The markers 11, 12 are detectable by an optical sensor device 13 that, in this example, is arranged on the cover 41 of the magnetic resonance chamber 2. The field of view of the optical sensor device 13 covers the entire patient bed 6 in the completely extended position (home position) shown in FIG. 1. The measurement data of the sensor device 13 are relayed to a computer 14 that forms an additional part of the position determination device according to the invention. The computer 14 can optionally be part of a control unit 15 of the magnetic resonance device 3, which is indicated by the box drawn in dashed lines. The computer 14 is fashioned to determine, from the measurement data of the sensor device 13, the coil position and the coil orientation along the longitudinal direction of the patient bed 6 for each local coil 8 arranged on the patient bed 6, as explained in detail in the following for different exemplary embodiments.

The method according to the invention can also be executed with the magnetic resonance system 1, which is presented in detail via the following, more detailed description of additional exemplary embodiments. First of all, however, it is noted that the computer 14 is fashioned in principle for the continuous determination of the measurement data of the sensor device 13 as of a start criterion (in particular the plugging of a local coil 8 into a slot of the patient bed 6 and/or the opening of a door of the magnetic resonance chamber 2) until an end criterion (in particular the insertion of the patient bed 6 into the patient receptacle 5 of the magnetic resonance device 3 and/or the closing of the door of the magnetic resonance chamber 2). The last determined coil position and coil orientation for every local coil 8 are thereby stored and provided to the control unit 15 of the magnetic resonance device 3 as a final coil position and coil orientation. This idea is based on the fact that the operator who arranges the local coils 8 on the patient bed 6 brings these into the field of view of the sensor device 13, after which they are first positioned. The positioning of the local coils 8 is also possibly subsequently corrected. The final position that corresponds to the last detected position (which does not necessarily coincide with the occurrence of the end criterion) is thus relevant, since it can occur that (for example) the coil markers 11 of a local coil 8 are covered by a cover or the like after the local coil 8 is positioned. Therefore, according to the invention, such a tracking is proposed with continuous acquisition of the measurement data. The measurement data of the sensor device 13 can moreover be evaluated immediately, or even be evaluated in a concluding complete evaluation only after the arrival of the end criterion.

The bed markers 12 can be used in a second manner. As mentioned, the coil position and coil orientation should be determined along the longitudinal axis of the patient bed 6. This should ensue in a coordinate system of the patient bed 6. Therefore, the coil marker 11 can on the one hand serve for implementation of a one-time calibration, wherein it is assumed that the measurement in the following always occurs at the same bed position (in particular in the completely extended bed position). Naturally, however, the bed markers 12 can also be continuously determined in terms of their position in order to be able to determine the position of the coil markers 11 relative to the bed markers 12.

Figure 2:
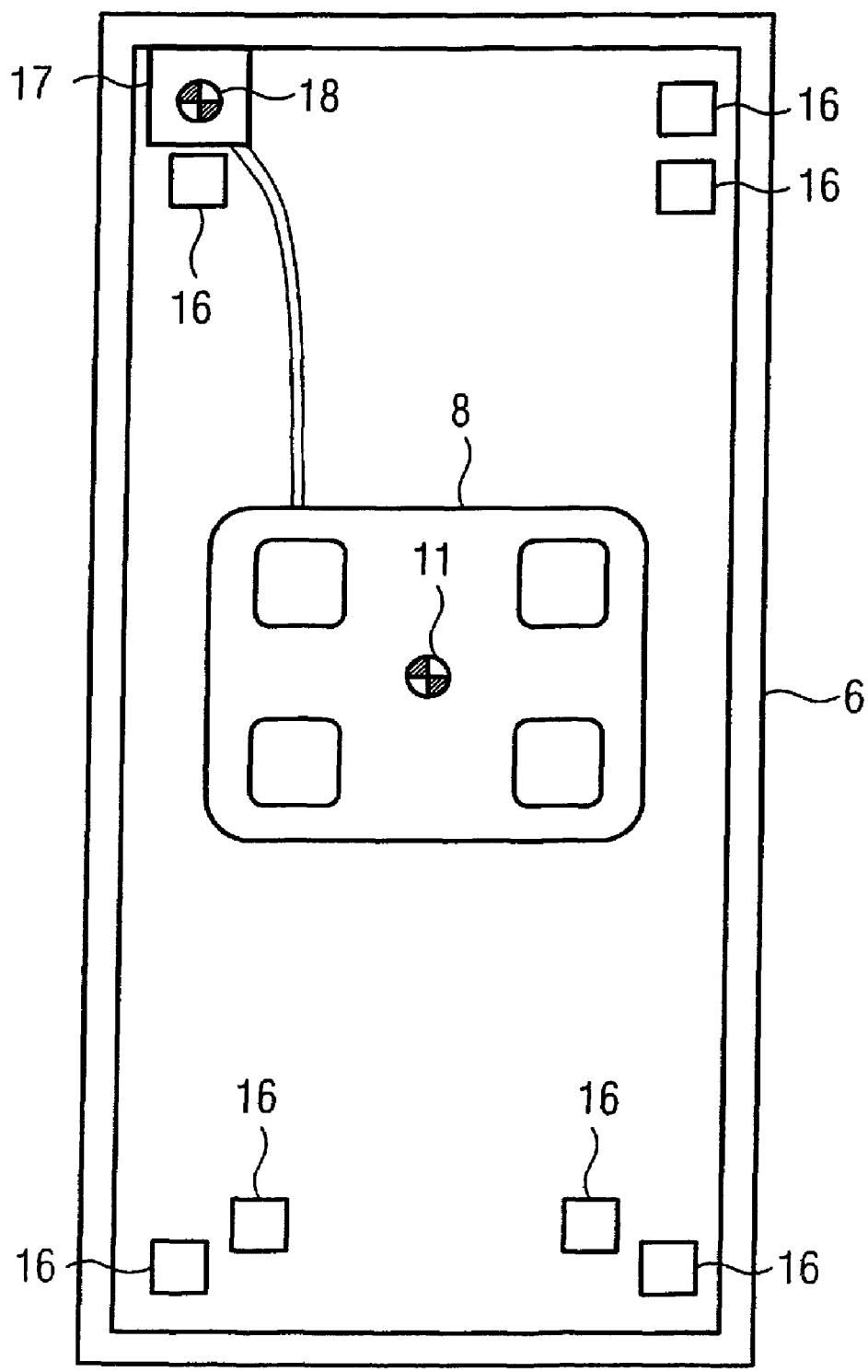
FIG. 2 us a view of a patient bed in a first exemplary embodiment of the present invention.

FIG. 2 now shows a view of the patient bed 6 of a first exemplary embodiment of the present invention.

Eight slots 16 for local coils 8 are clearly provided on the patient bed 6, wherein one of the slots 16 is already populated by a coil plug 17 of the local coil 8 (shown here as an example). An optical coil marker 11 that exhibits a clear contrast and is coil-specific is provided on the local coil 8. A plug marker 18 corresponding to the coil marker 11 is arranged on the coil plug 17 of the local coil 8.

For this exemplary embodiment, a camera sensitive in the visible range (for example a CCD camera) is provided as an optical sensor device. This can easily be located in a camera image via image processing due to the high-contrast markers 11, 18. In the patterning and the coloration of the markers 11, 18 it must be insured that they differ as clearly as possible from the surroundings, wherein presently markers 11, 18 emulating the markers of crash test dummies are used. Although the exemplary embodiment with optical markers in the visible range already offers advantages relative to a determination of the coil position and possibly coil orientation in comparison to a determination of the coil position by means of magnetic resonance data, it is less preferable since the image processing is quite complicated and the markers 11, 18 in the visible range could interfere with the overall optical impression.

In this first exemplary embodiment the plug marker 18 serves to associate the local coil 8 with a slot 16. Only in this way can it be established from which slot 16 the local coil 8 is to be controlled and—in the event that the local coil 8 and the slot 16 are fashioned to allow the model of the local coil 8 to be determined based on an internal resistance of the connected local coil 8—to associate the model of the local coil 8 with the position. This is possible since the position of the slots 16 is known and the coil plug 17 with the plug marker 18 is in principle located above this position.

Figure 3:
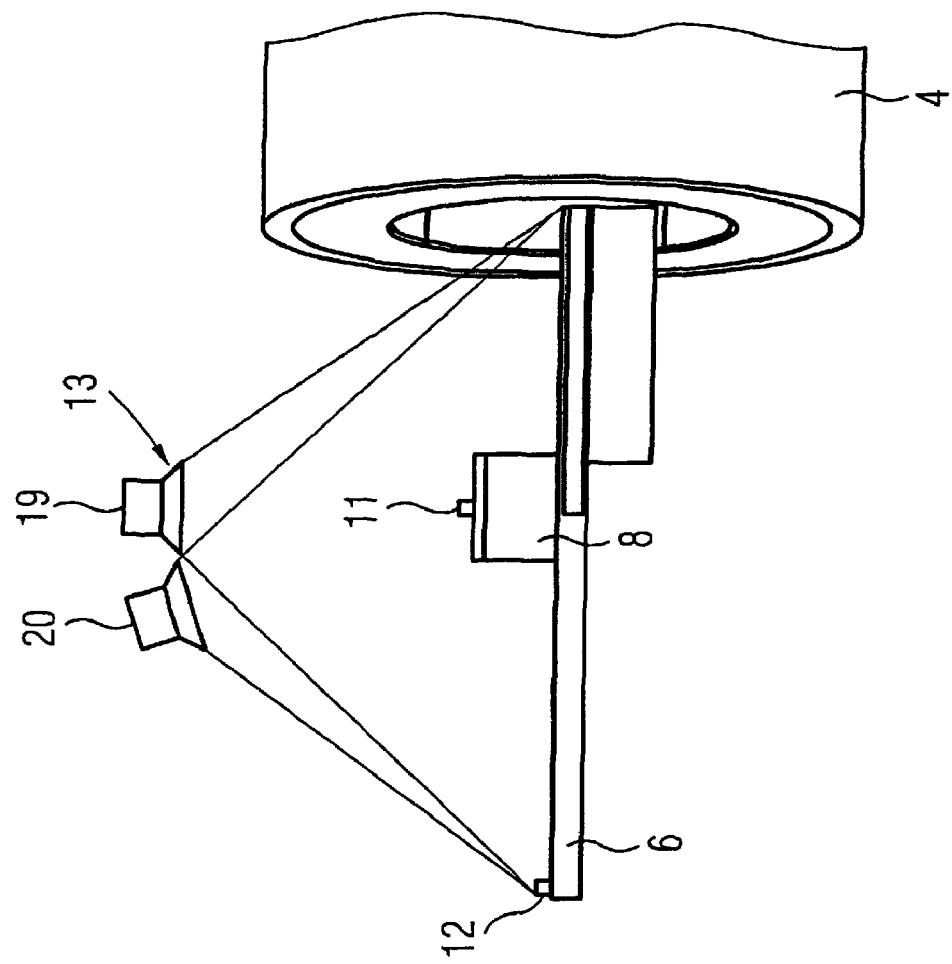
FIG. 3 schematically illustrates the functioning of a second exemplary embodiment of the present invention.

FIG. 3 shows a second exemplary embodiment of the present invention. For the sake of simplicity, only essential components are shown there. The optical sensor device 13 here is executed as a camera 19 sensitive in the infrared range whose field of view again covers the patient bed 6. A commercially available CCD camera was thereby used, wherein the infrared cat filter that is typically upstream of this has been replaced by a near-infrared filter that transmits only light in the near-infrared range. The markers (of which here again a coil marker 11 and a bed marker 12 are shown as examples) consists of a material that is also retro-reflective in the infrared range and are likewise provided with a light emission filter (not shown in detail here) that transmits only light in the near-infrared range. The markers 11, 12 are thus not visible in principle and are only made visible for the position determination.

The light source 20 arranged adjacent to the camera 19 serves for this purpose. The light source 20 radiates light in the near-infrared range, and in fact over the region of the entire patient bed 6. If the infrared light strikes the markers 11, 12, due to their retro-reflective properties these reflect superbly, and the camera 19 sensitive in the near-infrared range can take camera images in which essentially only the markers 11, 12 are visible. In order to be able to better detect the markers 11, 12 in the camera image, it can be provided that one image with activated light source 20 and one image with deactivated light source 20 are respectively acquired, in particular in immediate chronological succession, wherein these images are then subtracted from one another. Only the representations of the markers 11, 12 then remain in the resulting difference image.

Figure 4:
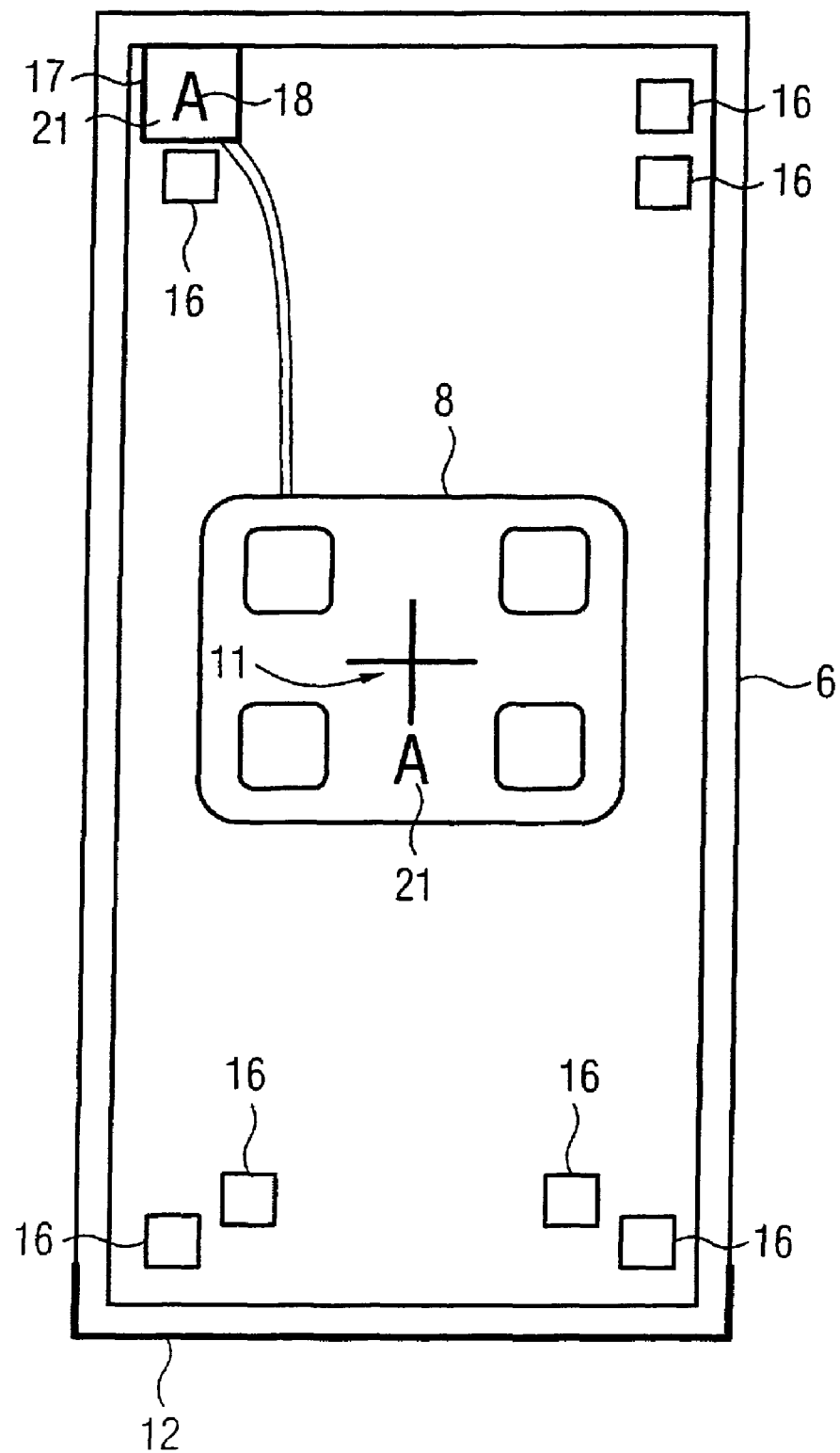
FIG. 4 is a view of a patient bed in the second exemplary embodiment of the present invention.

FIG. 4 shows a view of the patient bed 6 in the second exemplary embodiment. Again eight slots 16 are clearly provided. The bed marker 12 is arranged at the lower end of the patient bed 6, the coil-specific marker is centrally arranged on the central coil 8. In this case it comprises a coil-specific character sequence 21 that also occurs in the plug marker 18 of the coil plug 17. The embodiment of the coil marker 11 additionally allows the orientation of the local coil 8 to be determined in the longitudinal direction of the patient bed 6.

Figure 5:
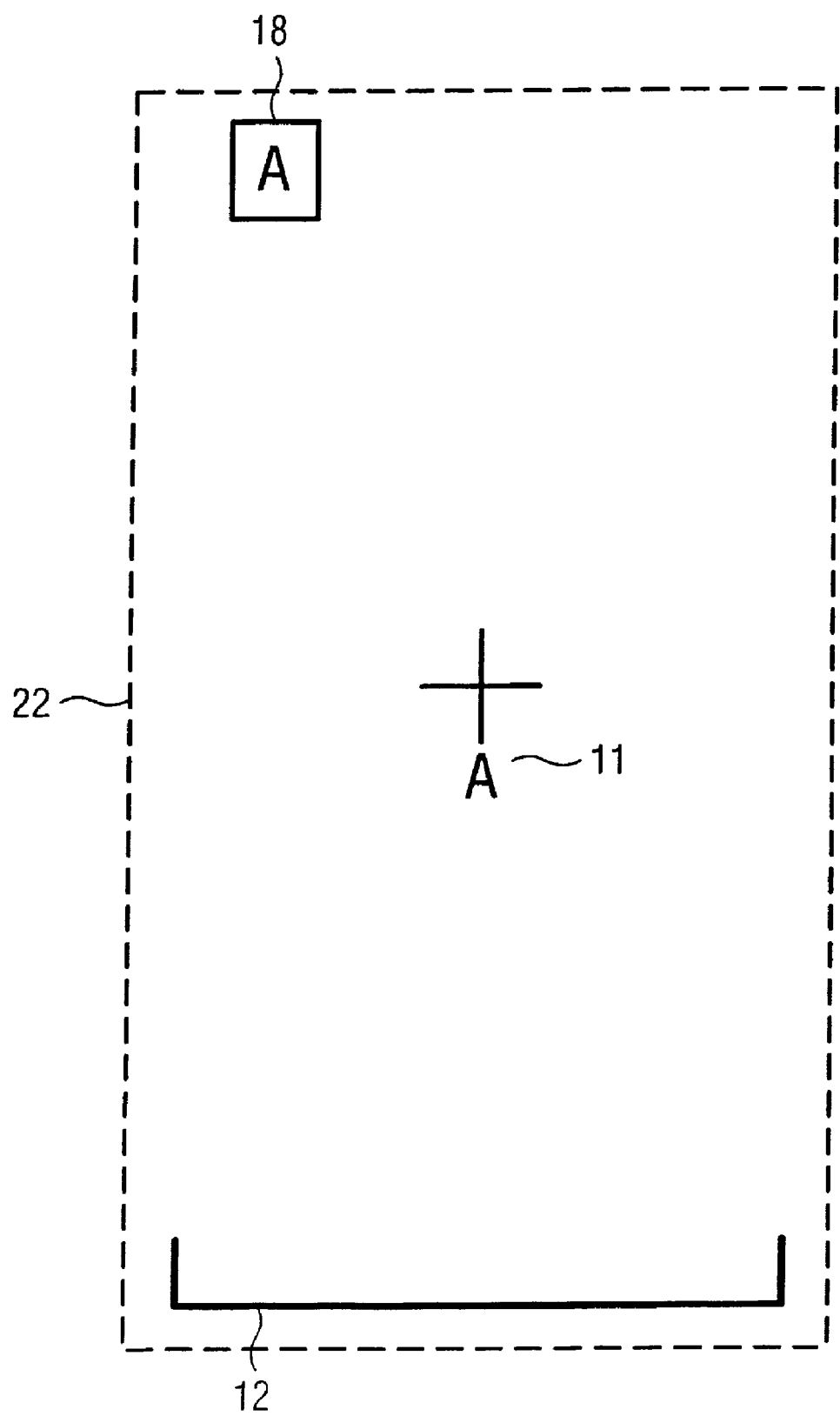
FIG. 5 shows an example of a difference image in the second exemplary embodiment of the present invention.

FIG. 5 shows a difference image 22 which was formed from the difference of a camera image with activated light source 20 and a camera image with deactivated light source 20. Only the coil marker 11, the bed marker 12 and the plug marker 18 are clearly recognizable in the difference image 22, such that a simpler image processing and detection of the markers 11, 12, 18 is possible in the difference image 22 due to the clearer patterns or character strings that are used, such that a determination of the coil position and coil orientation of the local coil 8 can ensue.

Instead of the shown infrared markers, fluorescent markers can be used that emit visible light under UV light. A camera that is sensitive in the normal range can then be used. In both cases (both in the infrared case and in the UV case of this second exemplary embodiment) the images can be acquired in a darkened room instead of the difference imaging between an image with deactivated light source and an image with activated light source. However, this is less preferable, in particular within the scope of the continuous detection presented above.

The image processing methods that are applied to the camera images and difference images are known in principle. Known pattern recognition methods (for example pattern matching methods such as cross-coordination) can be used.

Figure 6:
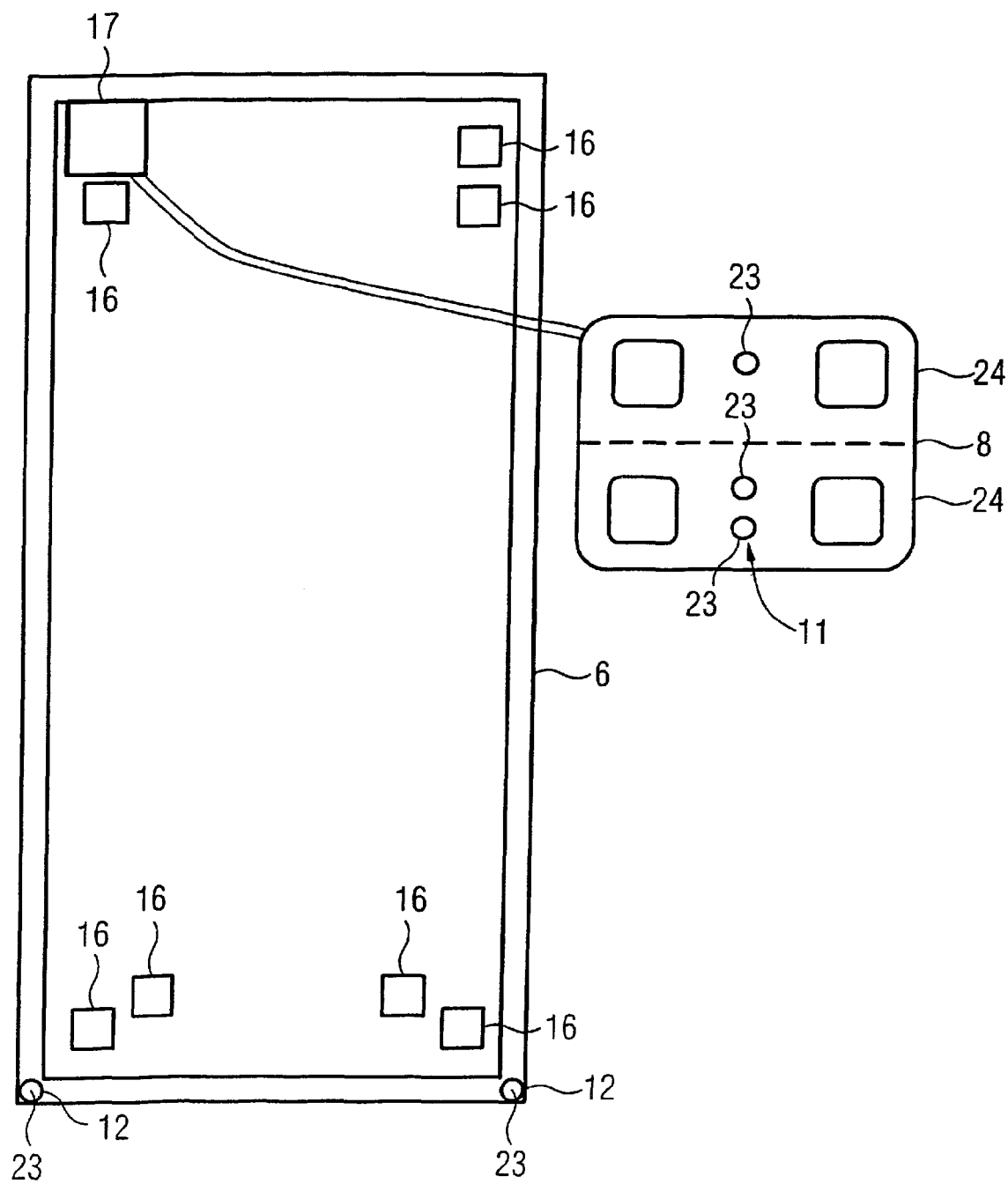
FIG. 6 is a view of the patient bed in a third exemplary embodiment of the present invention.

FIG. 6 shows a view of the patient bed 6 of a third exemplary embodiment during the positioning of a local coil 8. Eight slots 16 are again provided. The coil markers 11 and the bed markers 12 in this case are infrared diodes 23 fashioned to emit light in the near-infrared range upon being fed with current, which infrared diodes 23 begin to glow upon plugging the coil plug 17 into a slot 16. The infrared diodes 23 of the bed marker 12 glow continuously. FIG. 6 moreover shows the point in time at which the local coil 8 was just connected to the slot 16 of the patient bed 6. For example, this can by conducted by the operator who should position the local coils 8. This means that FIG. 6 shows both the moment at which the infrared diodes 23 of the coil marker 11 begin to glow and the moment at which what is known as a coil change event is registered in the control unit 15 of the magnetic resonance device 3. That means that the control unit 15 registers (due to a changing resistance) that the local coil 8 is inserted into a specific slot 16 of the patient bed 6. The model of the local coil 8 can also be determined based on the level of the resistance. The concurrence of these two events at a mutual time stamp is relevant in the association of the local coil 8 with a detected coil position, as is shown in the following.

Three infrared diodes 23 are clearly arranged on the local coil 8 along a straight line but at different intervals. Since the local coil 8 comprises two identical coil elements 24, its coil orientation along the longitudinal axis of the patient bed 6 is also relevant. This can easily be determined based on the arrangement of the three diodes 23 in the camera image.

The camera 19 of the second exemplary embodiment that is sensitive in the infrared range can again be used as a camera. This means that the camera image essentially shows only illuminated points at the positions of the infrared diodes 23, as will be explained in detail in the following. The camera images are binarized by the computer 14, wherein a threshold method is applied since ultimately only the infrared diodes 23 are extremely brightly visible in the camera image. In this way the image processing is markedly simplified and accelerated later. The determination of the coil position and the association of this coil position or coil orientation with a slot 16 and coil model is now explained in detail with the use of FIGS. 6 through 14. FIGS. 6 through 9 each show a view of the patient bed 6 in the third exemplary embodiment at different points in time while the local coil 8 is positioned. The position of the infrared diodes 23 of the coil marker 11 thereby also varies in the corresponding camera image, which is continuously generated in a known manner. In the shown example, the images are acquired by the camera 19 at 24 FPS. The resolution of the camera 19 should be selected so that the desired precision of the determination of the coil position is achieved. The continuous acquisition of the camera 19 yields a video stream that is stored in the computer 14. The coil change events are additionally captured with their points in time. If the end criterion arrives, the evaluation of the video stream begins. The entire infrared video stream is thereby divided into fragments that begin with a coil change event and end with a different coil change event or the end criterion. Three new bright points of light respectively occur in the video stream after every coil change event, which points of light are tracked in the video stream until they are no longer moving, meaning until the local coil 8 has been positioned. The coil position and the coil orientation of the local coil 8 can be determined from the position of these three points of light and of the points of light associated with the bed markers 12. This should now be graphically explained more precisely via Figures. FIGS. 10 through 14 respectively show binarized camera images of the video stream that are generated at different points in time.

Figure 10:
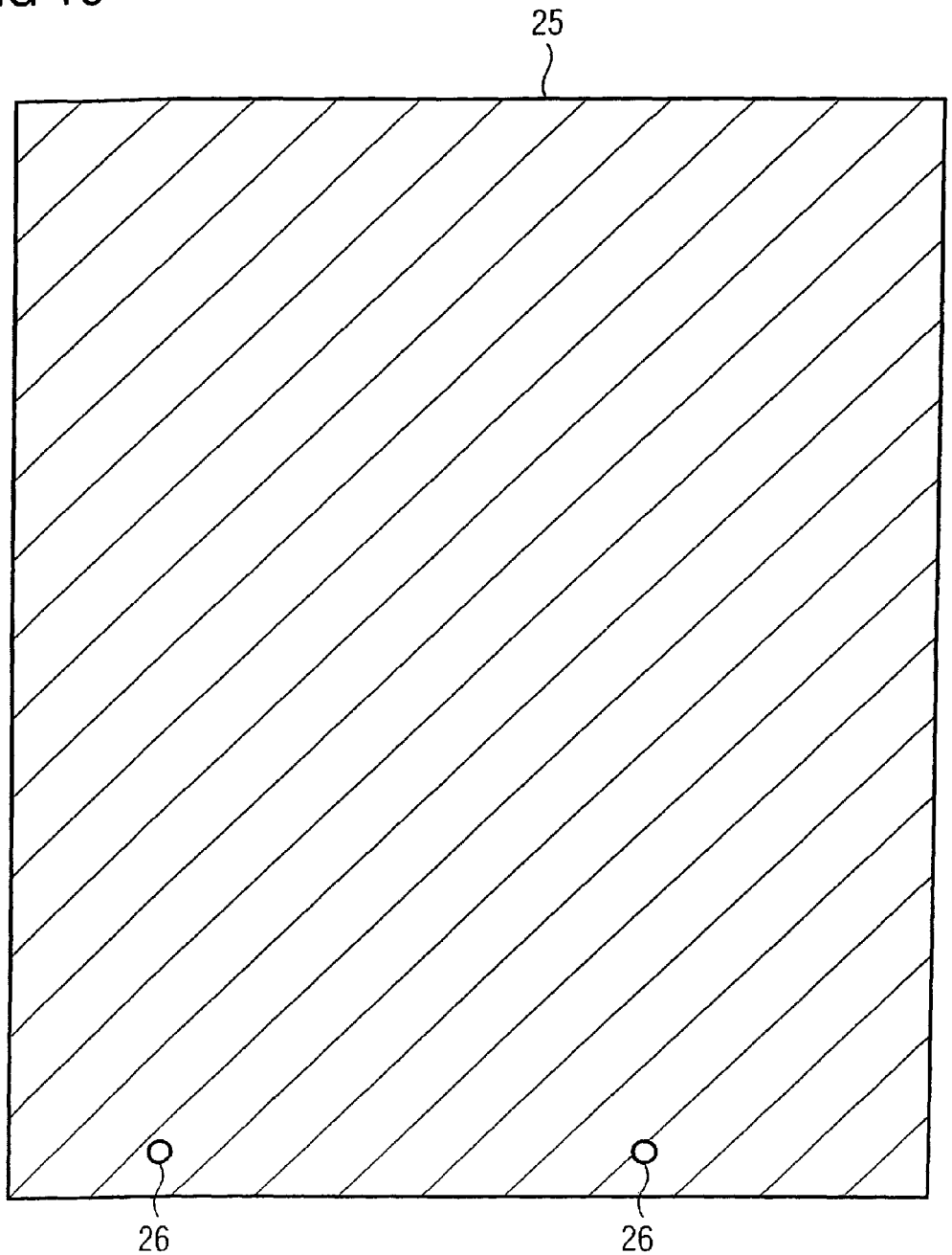
FIG. 10 shows an acquired, binarized camera image before the connection of the coil in FIG. 6.

FIG. 10 initially shows a binarized camera image 25 which was acquired before a local coil 8 was plugged into a slot 16 of the patient bed 6. Only the two points of light 26 that correspond to the infrared diodes 23 of the bed marker 12 are visible.

Figure 11:
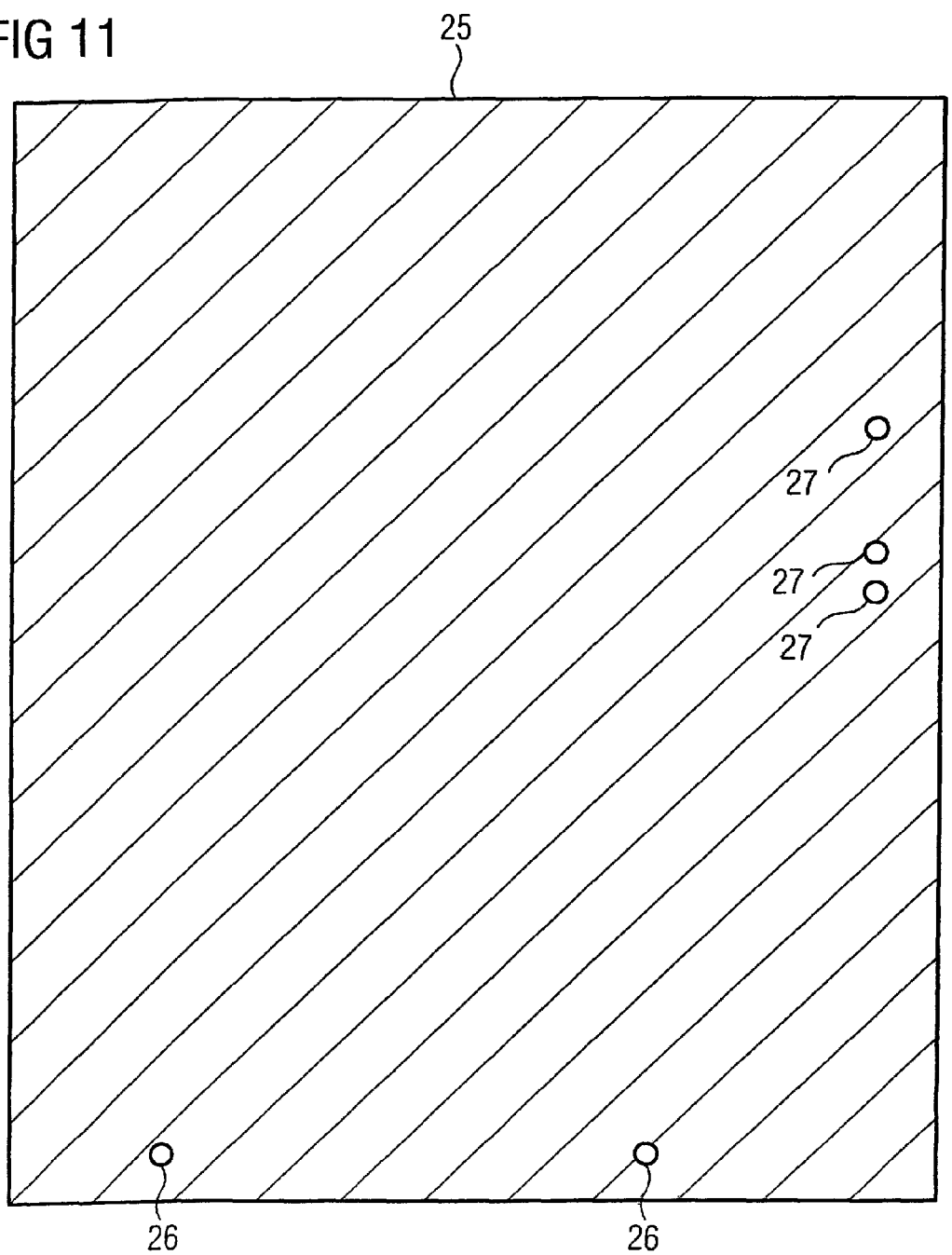
FIG. 11 shows a binarized camera image corresponding to FIG. 6.

FIG. 11 shows the point in time that corresponds to FIG. 6. The local coil 8 has been connected, meaning that the infrared diodes 23 of the coil marker 11 are now fed with current and for their part generate points of light 27 in the camera 25. The slot 16 and the coil information from the resistance measurement can be clearly associated with these points of light via the coil change event occurring simultaneously with the appearance of the points of light 27.

Figure 7:
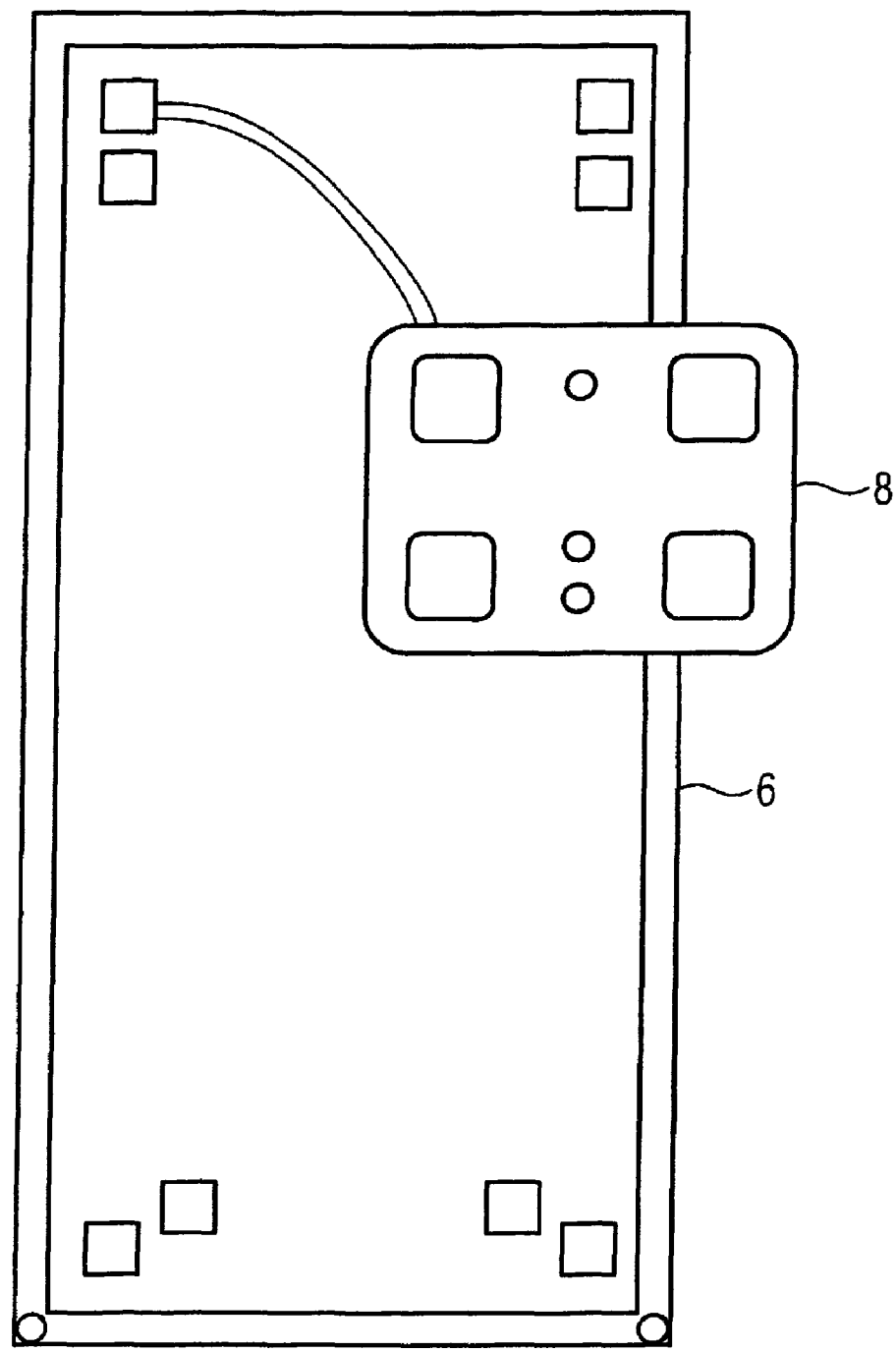
FIG. 7 is the view from FIG. 6 at a second point in time
Figure 12:
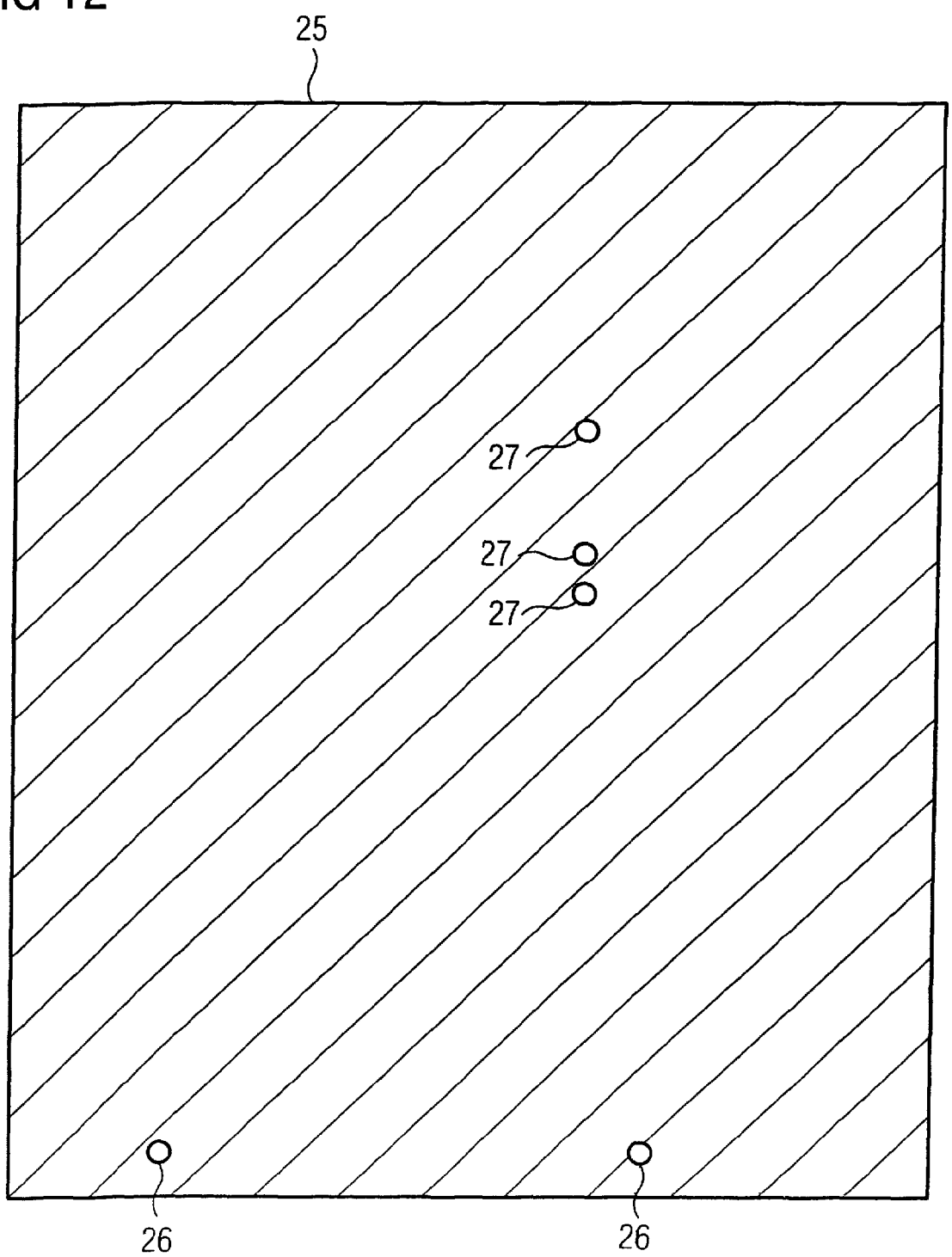
FIG. 12 shows a binarized camera image corresponding to FIG. 7.

FIG. 12 corresponds to the state shown in FIG. 7. The local coil 8 was clearly already moved somewhat further for positioning.

Figure 8:
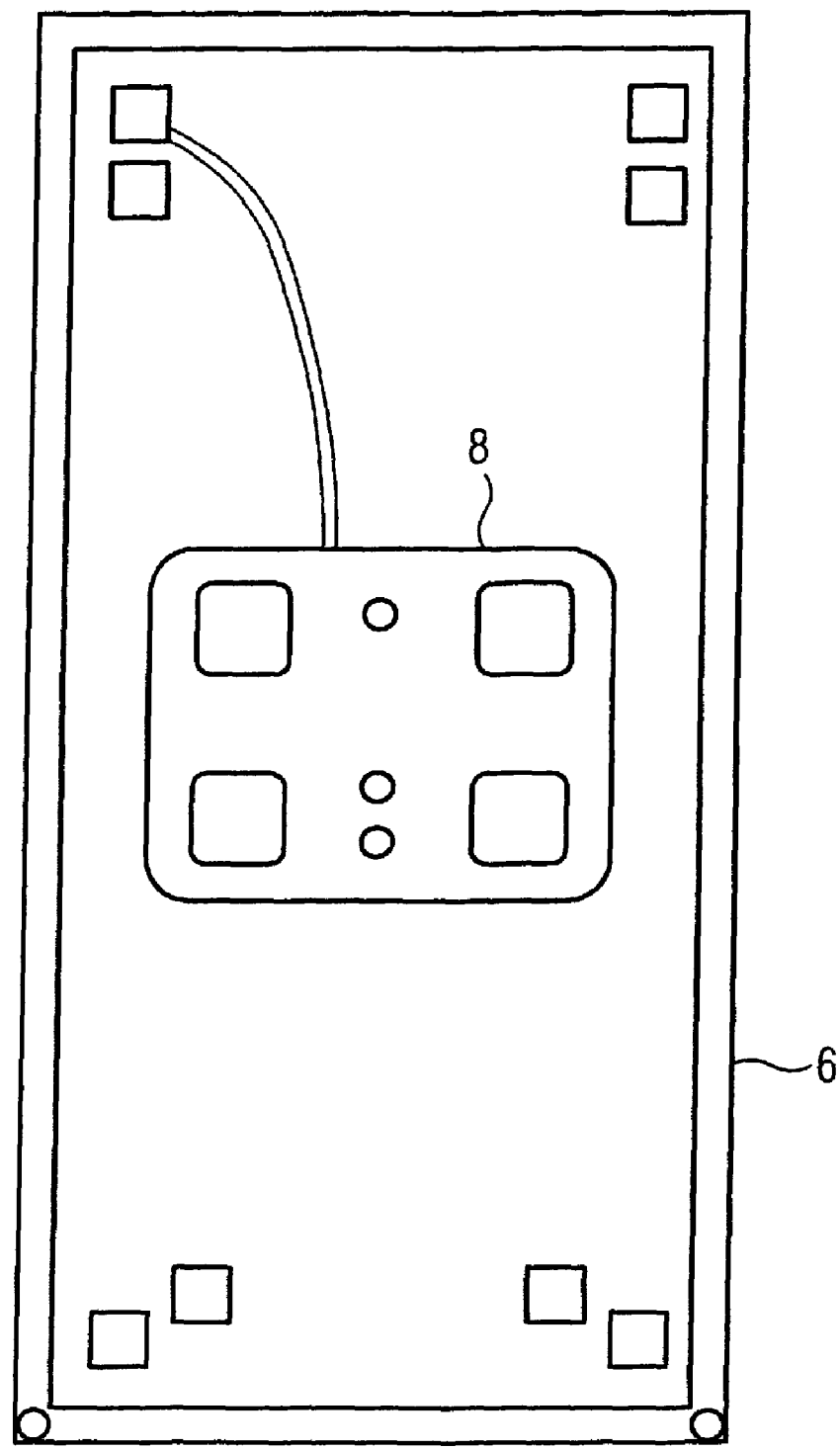
FIG. 8 is the view from FIG. 6 at a third point in time.
Figure 9:
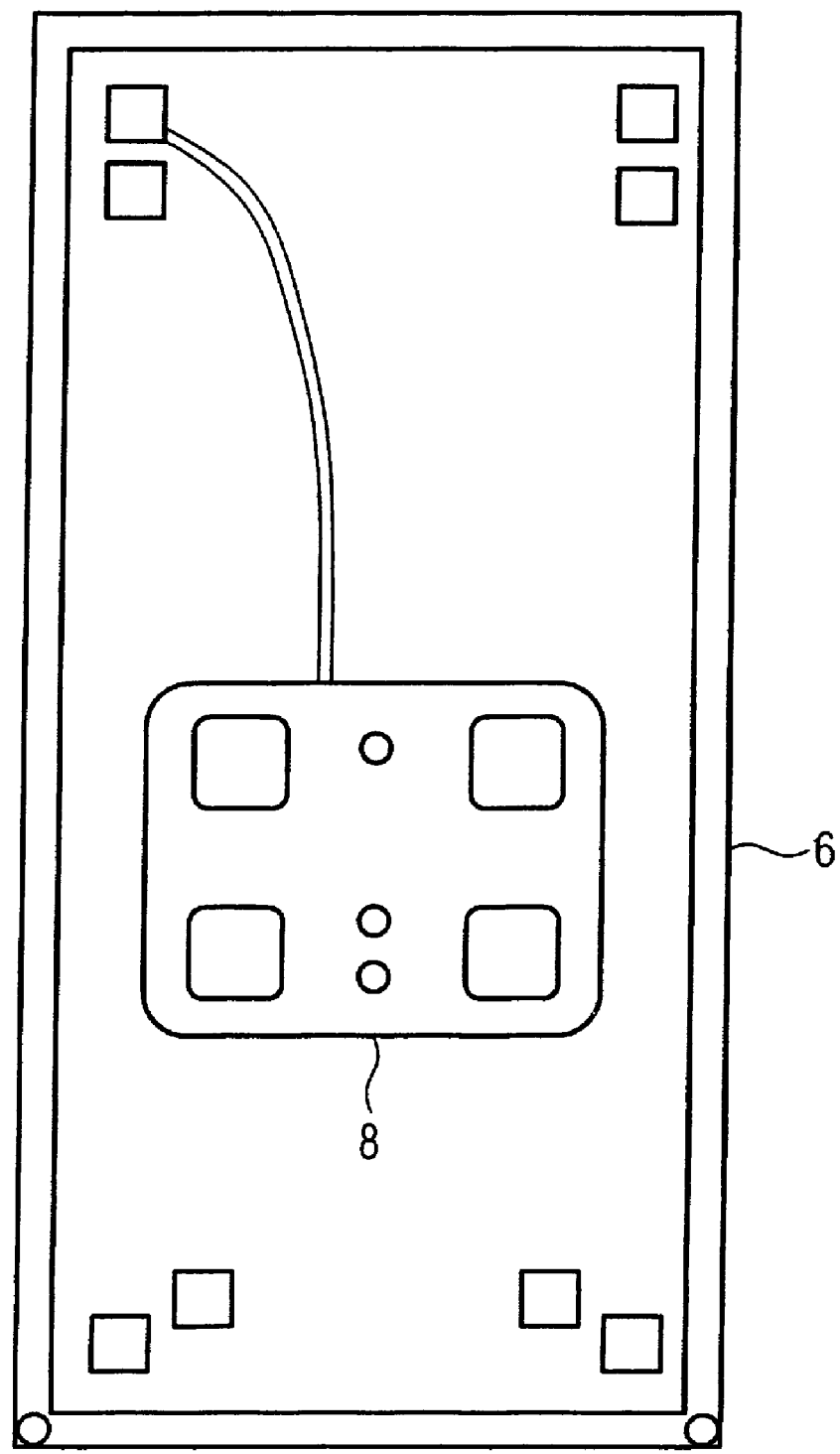
FIG. 9 is the view from FIG. 6 at a fourth point in time.
Figure 13:
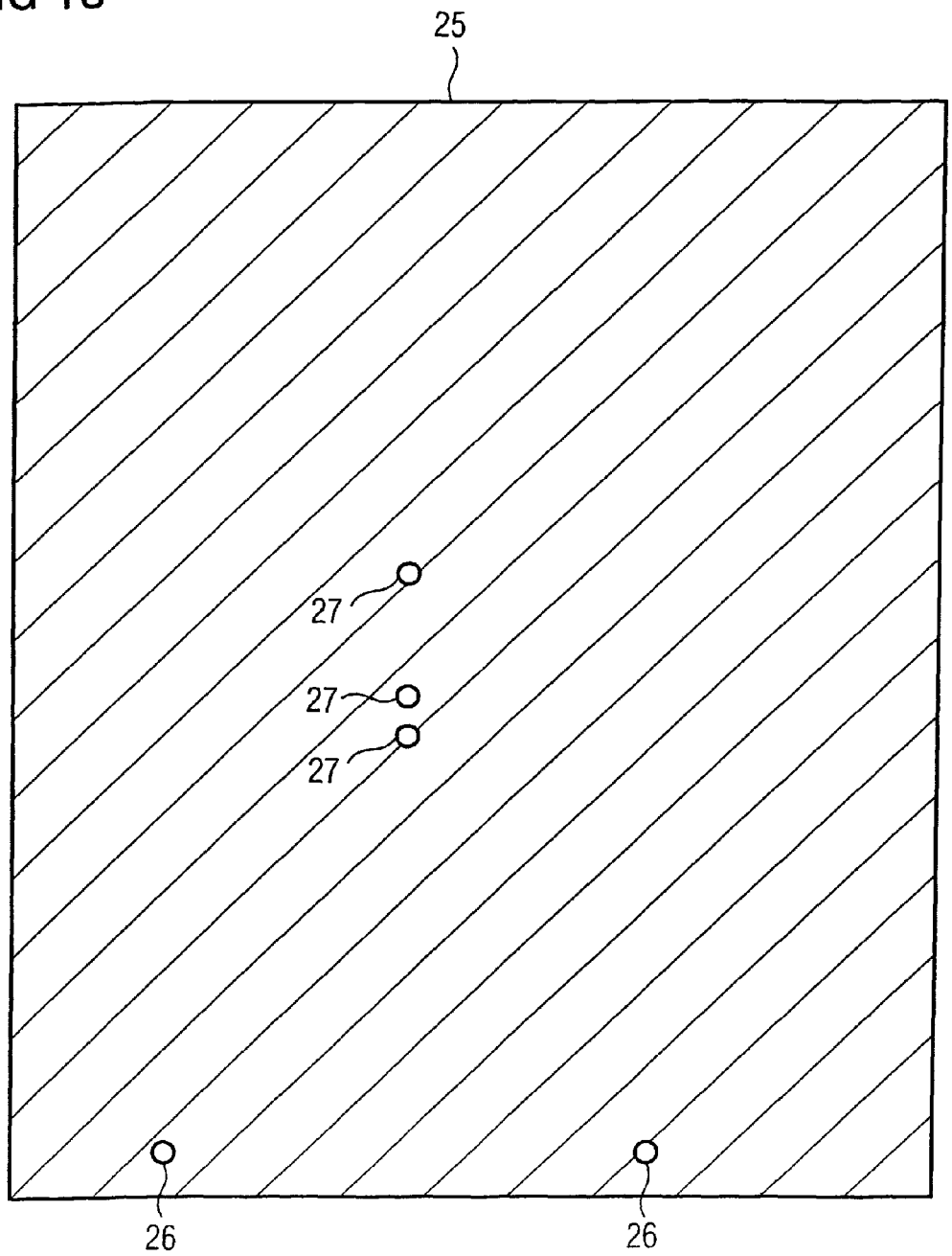
FIG. 13 shows a binarized camera image corresponding to FIG. 8.
Figure 14:
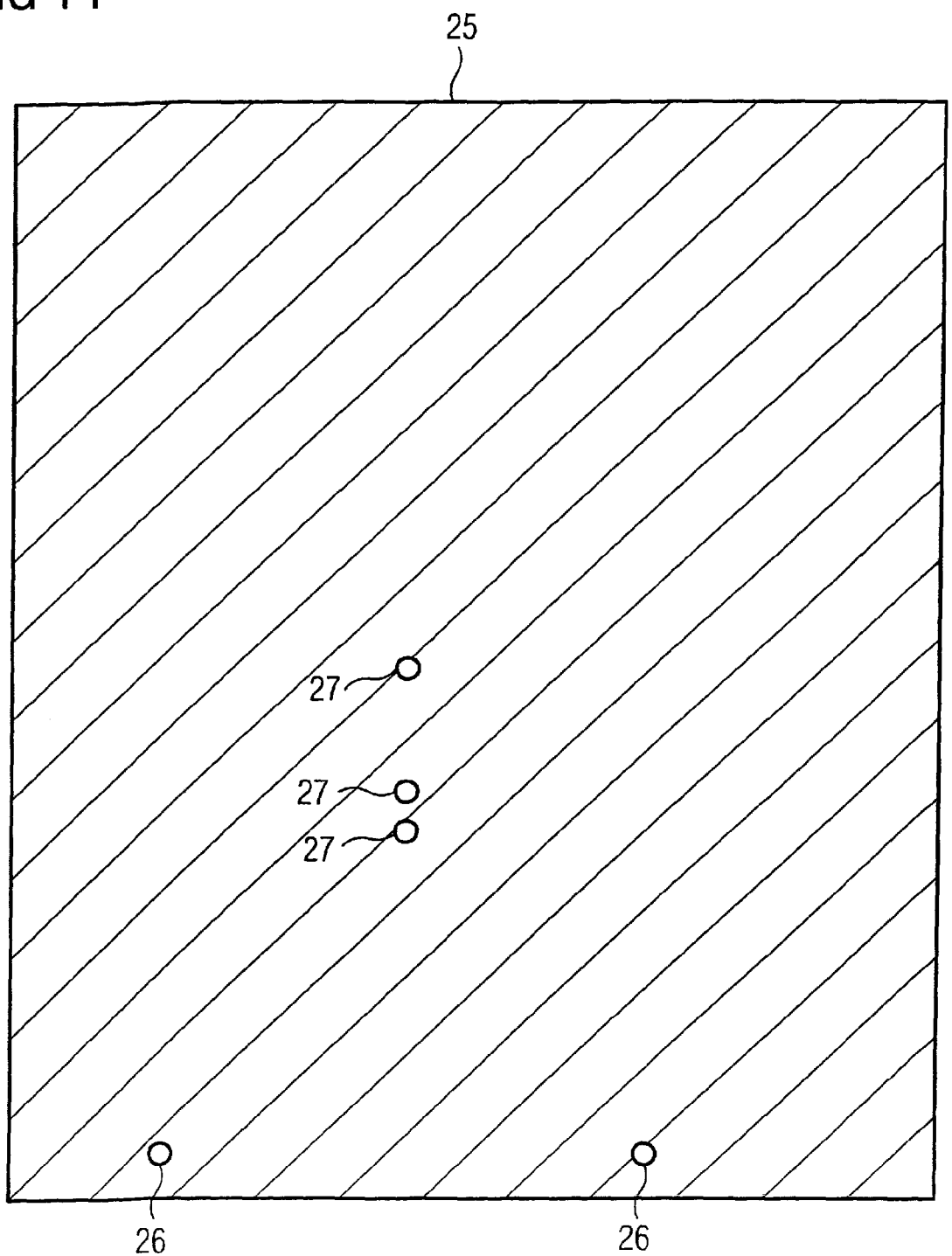
FIG. 14 shows a binarized camera image corresponding to FIG. 9.

FIG. 13 and FIG. 14 respectively correspond to FIGS. 8 and 9, in which the local coil 8 is already almost or entirely positioned. After the positioning of the local coil 8, the camera image 25 no longer changes; it remains as shown in FIG. 14. This last position of the points of light 27 is then used in order to determine the coil position and coil orientation of the local coil 8.

In contrast to the first two exemplary embodiments, the third exemplary embodiment thus shows active markers 12, 11 must be fed with current in order to emit detectable light, which however can even be advantageously used in the present third exemplary embodiment in order to associate the appearance of points of light 27 with a coil change event.

Although the present three exemplary embodiments have as a whole been presented with only one camera 19, in all embodiments two cameras 19 can be provided in order to correct projection errors arising due to the different thicknesses of different patients. The computer 14 is then fashioned for triangulation to determine the actual coil position in the longitudinal direction of the patient bed 6.

The previously shown first three exemplary embodiments of the present invention belong to a first group of exemplary embodiments of the present invention in which a camera 19 is used as a sensor device 13. The sensor device 13 can alternatively be composed of different types of optical sensors, as shown in the following by the example of PSD (position sensitive device) sensors as a second group of exemplary embodiments.

Figure 15:
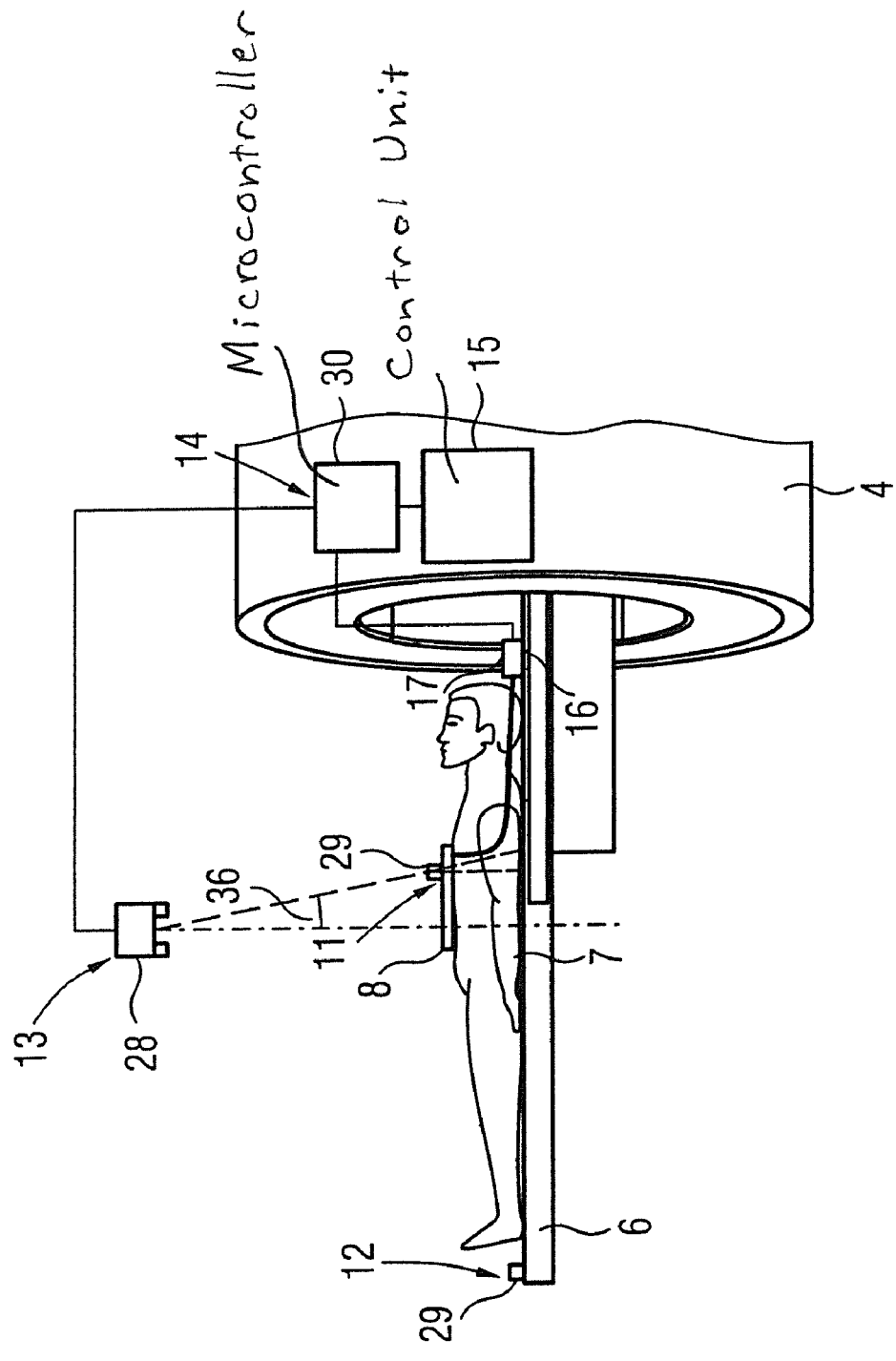
FIG. 15 schematically illustrates a fourth exemplary embodiment of the present invention.

FIG. 15 schematically shows a fourth exemplary embodiment of the present invention. A PSD device 28 is used as an optical sensor device 13. This can acquire the position of an individual point of light. This is generated by an activated infrared diode 29 that is used as a coil marker 11 or bed marker 12. The infrared diode 29 is also controlled by the computer 14 that in this case is fashioned as a microcontroller 30.

Figure 16:
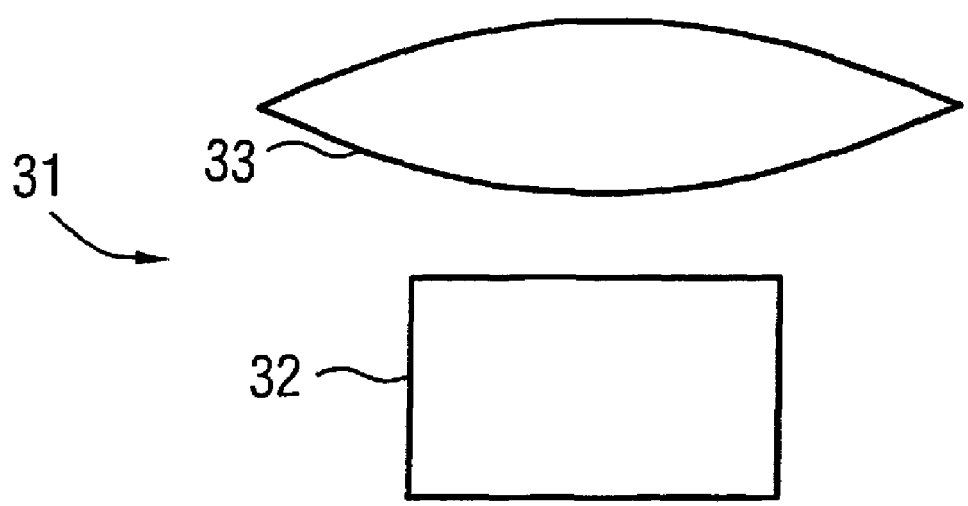
FIG. 16 shows a first embodiment of a PSD device.
Figure 17:
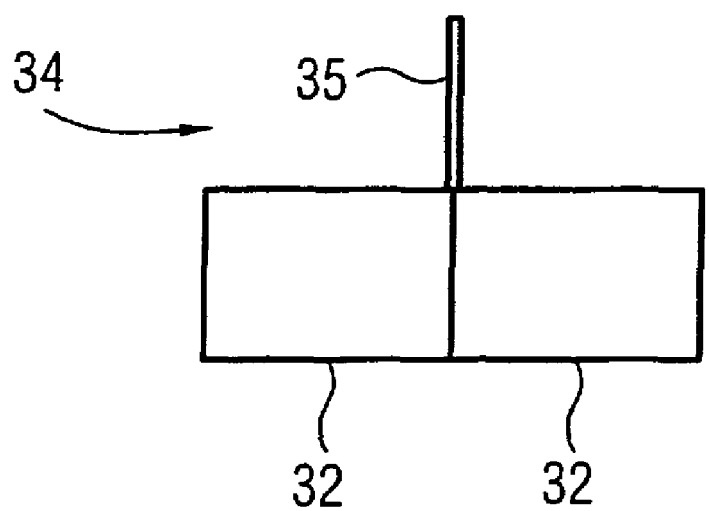
FIG. 17 shows a second embodiment of a PSD device.

The PSD device 28 can include two types of PSD sensors, which are respectively shown as alternatives in FIGS. 16 and 17. FIG. 16 shows an arrangement 31 a linear PSD sensor 32 (meaning a PSD sensor 32 formed by a continuous semiconductor) is used that can determine the position of the focal point of light on the surface of the semiconductor. Optics 33 are required so that the field of view of such a sensor 32 is extended to the entire patient bed 6.

The alternative shown in FIG. 17 is preferred. This alternative uses a sensor often designated as a combined PSD sensor 34, which is fashioned for angle measurement, and is formed by two PSD sensors separated by a divider element 35. Advantageously, no optics are required. The PSD sensor 34 fashioned for angle measurement additionally directly indicates the angle at which the light of a point of light strikes the PSD sensor 34. In the following the use of a PSD sensor 34 fashioned for angle measurement is assumed.

Such PSD sensors have the advantages that they operate very quickly (for example with a frequency of 10 kHz), readily commercially available, and, since they operate in analog, are very precise.

As noted above, however, the PSD device 28 can measure only the angle 36 of a single point of light (for example with a PSD sensor 34), shown in FIG. 15 for the infrared diode 29 of the coil marker 11. It is therefore necessary for the PSD device 28 and the infrared diodes 29 to be activated synchronously. The infrared diodes 29 are activated either by special control lines in the patient bed 6 connected to control connections in the slot 16 of the patient bed 6 in the case of the coil marker 11 on the local coil 8. Control lines of the local coil 8 that are not necessary outside of the magnetic resonance acquisition operation (such as the PIN diode lines) are used to activate the infrared diodes 29 within the local coil 8.

The computer 14 in the form of the microcontroller 30 (which can form a part of the control unit 15) is fashioned to respectively, successively, synchronously activate a diode 29 of a bed marker 12 or a control connection and the PSD device 28, meaning that at maximum only one infrared diode 29 is active at a time; sensor data are acquired while it glows (emits). If—as is explained later—two infrared diodes 29 are provided at the patient bed and two control connections are provided for each of the eight slots 16 of the patient bed 6, eighteen activation signals for infrared diodes 29 are thus always generated in succession (independently of whether they are present or not, meaning whether a local coil 8 is connected at a slot 16), and respective sets of sensor data are acquired by the PSD device 28. Sensor data (data sets) with regard to every infrared diode 29 or every control connection can be acquired multiple times per second to achieve a good signal/noise ratio since the PSD device 28 with the PSD sensors 34 is (as mentioned) very fast.

A very compact data stream is thereby acquired that is evaluated at the end. The data stream that is acquired and evaluated by the microcontroller 30 can include, for example, the following items: time stamp, number of the control connection/of the diode 29 of the bed marker 12, measured angle, and possibly the table position. As an alternative to the number of the control connection/of the infrared diode 29 of the bed marker 12, a triplet that includes the slot number, the PIN number and a corresponding coil code (or a code indicating that no coil is plugged in) can also be stored for the control connections in the event that the model of the local coil 8 can be detected.

After the occurrence of the end criterion, the coil position and coil orientations are determined from this data stream in that the last measurement value regarding an infrared diode 29 of the coil marker 11 is always considered, as was already described.

A microcontroller is completely sufficient for this evaluation, such that complicated additional electronics are not required. The determined coil positions or coil orientations are then passed to the control unit 15 of the magnetic resonance device 3 via the microcontroller 30 for further use.

Figure 18:
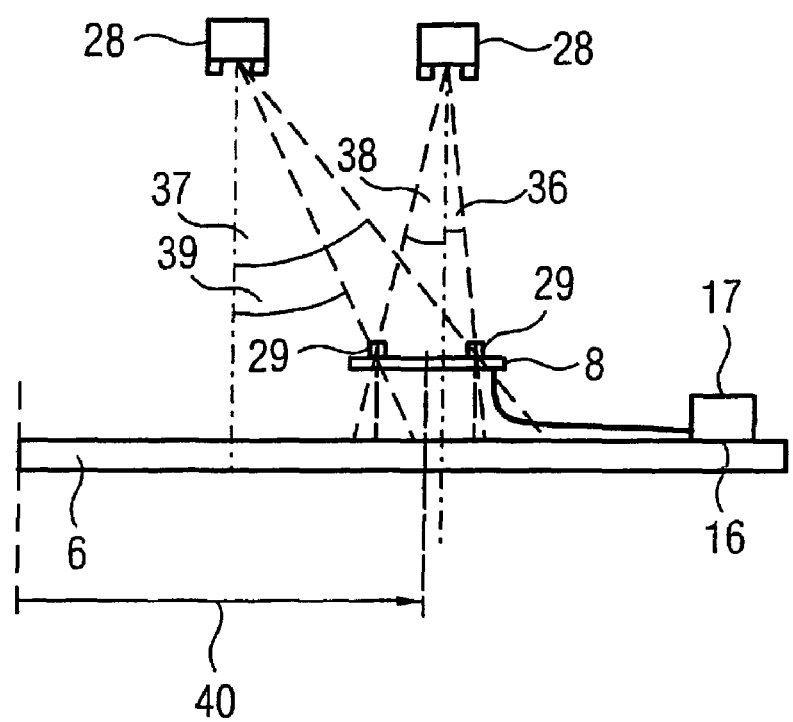
FIG. 18 schematically illustrates the operation of the fourth exemplary embodiment using two PSD devices.

Projection errors can also occur in this case due to different thicknesses of patients 7. Therefore two PSD devices 28 are also advantageously provided in the fourth exemplary embodiment, wherein the computer 14 (in the form of the microcontroller 30) is fashioned for triangulation. This is explained in detail by FIG. 18. Shown are two PSD devices 28 that are arranged at a distance from one another and two infrared diodes 29 of a local coil 8 arranged on the patient bed 6. For this purpose, two angles 36, 37, or 38, 39, are respectively measured so that the position of the infrared light-emitting diodes 20 on the local coil 8 can be determined in the longitudinal direction of the patient bed 6 by triangulation. The coordinate in the transverse direction of the patient bed 6 can also be determined with such a configuration. If three PSD devices 28 are used, even the completely three-dimensional position of an infrared diode 29 can be determined.

The coil position in the coordinate system of the patient bed 6 then can be easily determined from the positions of the infrared diodes 29, as indicated by the arrow 40. It is noted that here two infrared diodes 29 are sufficient to determine the coil orientation in the longitudinal direction of the patient bed 6, since it is known which infrared diode 29 is measured (detected) and when the detection occurs.

Figure 19:
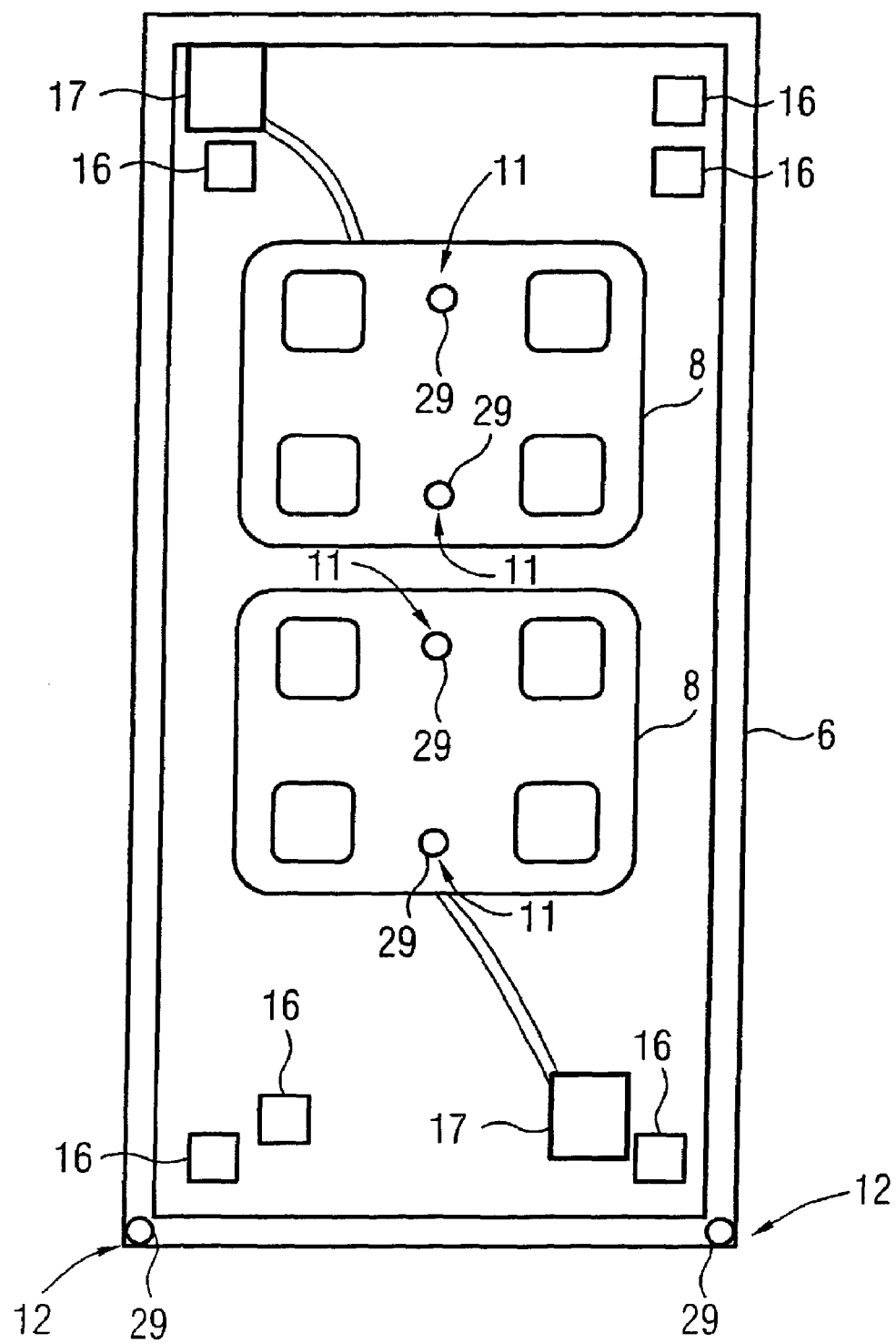
FIG. 19 is a view of a patient bed in the fourth exemplary embodiment.

FIG. 19 shows a view of a patient bed 6 in the fourth exemplary embodiment. In this case, two already-placed local coils 8 are indicated as examples. Each local coil 8 has two infrared light-emitting diodes 29 as coil markers 11. Two additional infrared light-emitting diodes 29 serve as bed markers 12. The infrared diodes 29 are successively activated and measured via the slots 16, or control lines running in the patient bed 6. Since six of the slots 16 are not populated, no infrared light-emitting diodes 29 glow at these locations.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. A device for determining a position of at least one local coil that is selectively placed at a location on a patient bed of a magnetic resonance apparatus, for which location a position of the local coil relative to the patient bed is not known with specificity, comprising:
   an optical coil marker configured for attachment to the local coil;
   an optical sensor device that detects said optical coil marker and that emits measurement data associated with detection of said optical coil marker, said optical sensor device having a field of view that encompasses said optical coil marker on said local coil and at least a portion of a surface of the patient bed, said surface being configured for placement of a patient thereon;
   a computer supplied with said measurement data from said optical sensor device, said computer being configured to automatically determine said position of the local coil relative to the patient bed from said measurement data; and
   a control unit that operates the magnetic resonance apparatus, said computer being a component of said control unit.

2. A device as claimed in claim 1 wherein said computer is configured to determine said coil position at least along a longitudinal direction of the patient bed.

3. A device as claimed in claim 1 comprising at least one optical bed marker attached to the patient bed, and wherein said optical sensor device also detects said bed marker and provides additional measurement data to said computer associated with said optical bed marker, and wherein said computer is configured to employ said measurement data associated with said optical bed marker in at least one of a calibration procedure and for determining said coil position.

4. A device as claimed in claim 1 wherein said computer is configured to continuously evaluate said measurement data to successively determine respective coil positions of said local coil within a time duration limited by an end criterion that represents an occurrence of a predetermined event, and to use a last-determined position of said local coil within said duration as said coil position.

5. A device as claimed in claim 4 wherein said computer is configured to begin said time duration dependent on a start criterion, that represents a predetermined event.

6. A device as claimed in claim 1 wherein said optical sensor device is a camera that generates a camera image as said measurement data, and wherein said computer is configured for image processing of said camera image to identify said coil position therefrom.

7. A device as claimed in claim 6 wherein said optical coil marker is a passive, unactivated marker, selected from the group consisting of reflective markers and fluorescing markers.

8. A device as claimed in claim 7 wherein said optical coil marker presents, to said optical sensor device, a coil-specific indicator.

9. A device as claimed in claim 7 comprising a light source that illuminates said passive, unactivated marker, said light source being selected from the group consisting of UV light sources and infrared light sources.

10. A device as claimed in claim 9 wherein said passive, unactivated marker is a retro-reflective marker.

11. A device as claimed in claim 9 wherein said light source is activatable and de-activatable, and wherein said computer is configured to evaluate a first camera image with the light source activated and a second camera image with the light source de-activated, by forming a difference image between said first and second camera images.

12. A device as claimed in claim 6 wherein said local coil is attached to said patient bed by a coil plug, and wherein said device comprises a plug marker that is detectable by said camera.

13. A device as claimed in claim 12 wherein said computer is configured to additionally determine a plug position of a local coil from said camera image and to link said plug position with coil type information supplied to said computer from a utilized slot in which said coil plug is plugged.

14. A device as claimed in claim 6 wherein said optical marker comprises at least one light emitting diode that emits light in a range selected from the group consisting of the infrared range and the ultraviolet range.

15. A device as claimed in claim 14 wherein said light emitting diode is a continuously emitting light emitting diode connected to a slot at said patient bed at which said local coil is connected.

16. A device as claimed in claim 15 wherein said computer is configured to associate the light emitting diode with a coil marker that is detected in the camera image for a specific local coil by associating a point in time of emission of light from said diode in the camera image with a point in time that the local coil was plugged into the slot of the patient bed.

17. A device as claimed in claim 14 wherein said computer is configured to binarize the camera image according to a threshold to cause only light from said light emitting diode to be visible in said camera image.

18. A device as claimed in claim 14 comprising, for each local coil, at least three light emitting diodes.

19. A device as claimed in claim 18 wherein said optical sensor device comprises a plurality of cameras that each generate a camera image, and wherein said computer is configured to determine said coil position, and a coil orientation, by triangulation of said camera images.

20. A device as claimed in claim 1 wherein said optical sensor device is a PSD device that is sensitive in the infrared range, and wherein said optical marker is an infrared-emitting diode that is activatable to emit infrared light.

21. A device as claimed in claim 20 wherein said PSD device comprises a PSD sensor and optics upstream of said PSD sensor, said optics expanding a field of view of said PSD sensor to encompass an entire area of said patient bed.

22. A device as claimed in claim 20 wherein said PSD device comprises a PSD sensor configured for angle measurement.

23. A device as claimed in claim 20 wherein said computer is configured to activate the diode forming the optical coil marker by control connections in respective slots of said patient bed.

24. A device as claimed in claim 23 wherein said computer is configured to successively synchronously activate respective infrared diodes of a bed marker through a control connection, and wherein said PSD device detects infrared emission from said bed marker.

25. A device as claimed in claim 24 wherein said computer is a micro-controller, and is configured to designate said coil position with a time stamp.

26. A device as claimed in claim 25 wherein said computer is configured to associate a coil type with said coil position by obtaining slot-specific coil type information from a slot at said patient bed at which said local coil is plugged in.

27. A device as claimed in claim 20 wherein said local coil has control lines that activate said optical sensor.

28. A device as claimed in claim 20 wherein said optical marker comprises two independently controllable infrared-emitting diodes for each local coil.

29. A device as claimed in claim 20 comprising a plurality of PSD devices connected to said computer, and wherein said computer is configured to additionally determine a coil position and coil orientation by triangulation of outputs from the plurality of PSD devices.

30. A magnetic resonance system comprising:
at least one local coil;
a patient bed on which the local coil is placed at a location for which a position of the local coil relative to the patient bed is not known with specificity; and
a device for determining a position of the local coil relative to the patient bed, comprising an optical coil marker on the local coil, an optical sensor device that detects said optical coil marker and that emits measurement data associated with detection of said optical coil marker, said optical sensor device having a field of view that encompasses said optical coil marker on said local coil and at least a portion of a surface of the patient bed, said surface being configured for placement of a patient thereon, and a computer supplied with said measurement data from said optical sensor device, said computer being configured to automatically determine said position of the local coil relative to the patient bed from said measurement data, and a control unit that operates the magnetic resonance apparatus, said computer being a component of said control unit.

31. A method for determining a position of at least one local coil relative to a patient bed of a magnetic resonance apparatus, comprising the steps of:
placing a local coil at a selected location on a patient bed of a magnetic resonance apparatus, for which location a position of the local coil relative to the local coil is not known with specificity;
attaching an optical coil marker on the local coil;
with an optical sensor device, detecting said optical coil marker and emitting measurement data associated with detection of said optical coil marker, said optical sensor device having a field of view that encompasses said optical coil marker on said local coil and at least a portion of a surface of the patient bed, said surface being configured for placement of a patient thereon;
supplying a computer with said measurement data from said optical sensor device, and in said computer, automatically determining a coil position of the local coil relative to the patient bed from said measurement data.

* * * * *